United States Patent
Chang

(10) Patent No.: US 12,256,552 B2
(45) Date of Patent: *Mar. 18, 2025

(54) ANALOG NON-VOLATILE MEMORY DEVICE USING POLY FERROELECTRIC FILM WITH RANDOM POLARIZATION DIRECTIONS

(71) Applicant: Taiwan Semiconductor Manufacturing Co., Ltd., Hsinchu (TW)

(72) Inventor: Chih-Sheng Chang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/525,301

(22) Filed: Nov. 30, 2023

(65) Prior Publication Data

US 2024/0114691 A1   Apr. 4, 2024

Related U.S. Application Data

(63) Continuation of application No. 17/852,818, filed on Jun. 29, 2022, now Pat. No. 11,856,784, which is a (Continued)

(51) Int. Cl.
*H10B 51/30* (2023.01)
*G11C 11/22* (2006.01)
*H01L 49/02* (2006.01)

(52) U.S. Cl.
CPC ............ *H10B 51/30* (2023.02); *G11C 11/223* (2013.01); *G11C 11/2275* (2013.01); *G11C 11/2297* (2013.01); *H01L 28/75* (2013.01)

(58) Field of Classification Search
CPC ........ H10B 51/30; H10B 53/30; H10B 53/00; G11C 11/223; G11C 11/2275;
(Continued)

(56) References Cited

U.S. PATENT DOCUMENTS 6,370,056 B1   4/2002   Chen et al.
9,269,785 B2   2/2016   Mueller et al.
(Continued)

FOREIGN PATENT DOCUMENTS

CN        1453854 A       11/2003
CN      106537509 A        3/2017
(Continued)

OTHER PUBLICATIONS

Kobayashi, et al., "Ferroelectric HfO2 Tunnel Junction Memory With High TER and Multi-Level Operation Featuring Metal Replacement Process," IEEE Journal of the Electron Devices Society, vol. 7, Mar. 1, 2019, 6 pages.

*Primary Examiner* — Fernando Hidalgo
(74) *Attorney, Agent, or Firm* — Slater Matsil, LLP

(57) ABSTRACT

A semiconductor device includes a ferroelectric field-effect transistor (FeFET), wherein the FeFET includes a substrate; a source region in the substrate; a drain region in the substrate; and a gate structure over the substrate and between the source region and the drain region. The gate structure includes a gate dielectric layer over the substrate; a ferroelectric film over the gate dielectric layer; and a gate electrode over the ferroelectric film.

20 Claims, 11 Drawing Sheets

Related U.S. Application Data continuation of application No. 16/733,029, filed on Jan. 2, 2020, now Pat. No. 11,380,708.

(60) Provisional application No. 62/894,505, filed on Aug. 30, 2019.

(58) Field of Classification Search
CPC .............. G11C 11/2297; G11C 11/221; G11C 11/2257; G11C 11/2259; G11C 11/2273; G11C 11/54; G11C 11/5657; G11C 27/00; H01L 28/75; H01L 29/40111; H01L 29/516; H01L 29/78391; H01L 29/6684; H01L 21/02181; H01L 28/40
USPC ......................................................... 257/295
See application file for complete search history.

(56) References Cited

U.S. PATENT DOCUMENTS

| | | | |
|---|---|---|---|
| 9,818,468 | B2 | 11/2017 | Muller |
| 11,004,975 | B2 | 5/2021 | Tu et al. |
| 11,380,708 | B2 * | 7/2022 | Chang .................. H01L 29/516 |
| 11,728,332 | B2 | 8/2023 | Chang et al. |
| 11,856,784 | B2 * | 12/2023 | Chang ............... H01L 29/78391 |
| 2003/0021479 | A1 | 1/2003 | Oku |
| 2003/0203512 | A1 | 10/2003 | Kweon |
| 2004/0129987 | A1 | 7/2004 | Uchiyama et al. |
| 2005/0059172 | A1 | 3/2005 | Kim |
| 2006/0081901 | A1 | 4/2006 | Arimoto et al. |
| 2010/0033938 | A1 | 2/2010 | Kitagawa et al. |
| 2010/0073988 | A1 | 3/2010 | Takahashi |
| 2011/0170330 | A1 | 7/2011 | Oezyilmaz et al. |
| 2014/0169061 | A1 | 6/2014 | Bibes et al. |
| 2015/0214322 | A1 | 7/2015 | Mueller et al. |
| 2016/0064510 | A1 * | 3/2016 | Mueller .................. H10B 53/30 257/295 |
| 2018/0012123 | A1 | 1/2018 | Han et al. |
| 2018/0240803 | A1 | 8/2018 | Yoo |
| 2018/0269057 | A1 | 9/2018 | Lei et al. |
| 2018/0366477 | A1 | 12/2018 | Liu |
| 2019/0318775 | A1 | 10/2019 | Rakshit et al. |
| 2020/0065647 | A1 * | 2/2020 | Mulaosmanovic .... G06N 3/049 |
| 2020/0195241 | A1 | 6/2020 | Murphy et al. |

FOREIGN PATENT DOCUMENTS

| | | |
|---|---|---|
| CN | 108122909 A | 6/2018 |
| CN | 108183107 A | 6/2018 |
| CN | 110085271 A | 8/2019 |
| JP | H09213819 A | 8/1997 |
| JP | 2000156470 A | 6/2000 |
| JP | 2003017663 A | 1/2003 |
| KR | 19990016997 A | 3/1999 |
| KR | 20110081183 A | 7/2011 |
| KR | 20180097378 A | 8/2018 |
| TW | 201533888 A | 9/2015 |
| TW | 201835373 A | 10/2018 |

\* cited by examiner

ANALOG NON-VOLATILE MEMORY DEVICE USING POLY FERRORELECTRIC FILM WITH RANDOM POLARIZATION DIRECTIONS

CROSS-REFERENCE AND PRIORITY CLAIMS

This application is a continuation of U.S. patent application Ser. No. 17/852,818, filed Jun. 29, 2022, entitled "Analog Non-Volatile Memory Device Using Poly Ferroelectric Film with Random Polarization Directions," which is a continuation of U.S. patent application Ser. No. 16/733,029, filed Jan. 2, 2020, entitled "Analog Non-Volatile Memory Device Using Poly Ferroelectric Film with Random Polarization Directions," (now U.S. Pat. No. 11,380,708, issued Jul. 5, 2022) which claims the benefit of U.S. Provisional Application No. 62/894,505, filed on Aug. 30, 2019 and entitled "Analog Non-Volatile Memory Device Using Poly Ferroelectric Film with Random Polarization Directions," which applications are hereby incorporated herein by reference.

TECHNICAL FIELD

The present invention relates generally to non-volatile memory devices, and, in particular embodiments, to non-volatile memory devices formed using a ferroelectric film with random polarization directions.

BACKGROUND

In artificial intelligence (AI) and/or machine learning (ML) applications, the deep neural network (DNN), or a layer thereof, is often modeled as a matrix $W_{M \times N}$, and the relation between the input vector $X_N$ and the output vector $Y_M$ of the DNN (or a layer thereof) is often described as $Y_M = W_{M \times N} X_N$, where $X_N$ is an N×1 vector, $Y_M$ is an M×1 vector, and $W_{M \times N}$ is an M×N matrix. As the dimensions of the input vector and the output vector increase, the number of Multiply-Accumulate (MAC) operations increases proportionally with M×N.

Analog non-volatile memory (NVM) synapse, used in analog computing for AI/ML applications, has the potential to greatly improve the speed and the power efficiency for the complicate and intensive computations in AI/ML applications.

For AI/ML applications, it may be advantageous for the synapse to have linear and symmetry response to training pulses. However, conventional ferroelectric (FE) based NVM synapse has nonlinear response to training pulses and thus has accuracy issue for ML applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
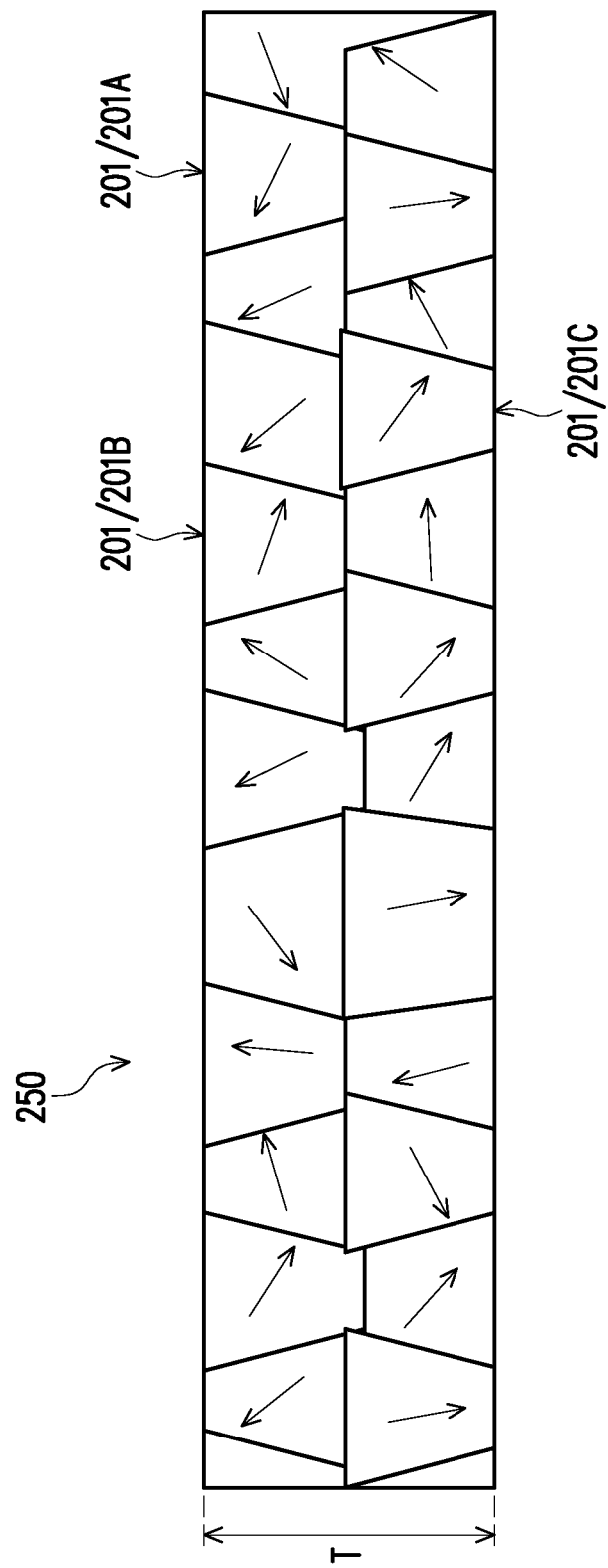
FIG. 1 illustrates a cross-sectional view of a ferroelectric film with random polarization directions, in an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Throughout the description herein, unless other specified, the same reference numeral in different figures refers to the same or similar component formed by a same or similar method using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a ferroelectric film with random polarization directions is formed, which has a plurality of (e.g., three or more) effective coercive fields. Ferroelectric field-effect transistors (FeFET) built using the disclosed ferroelectric film are disclosed. Each of the disclosed FeFETs has a plurality of (e.g., three or more) programmable threshold voltage values that are set by a programming voltage. Ferroelectric tunnel junctions (FTJs) built using the disclosed ferroelectric film are disclosed. Each of the disclosed FTJs has a plurality of (e.g., three or more) programmable electrical resistance values that are set by a programming voltage. The disclosed FeFETs and FTJs are used to form memory cells with a 1T1FeFET or 1T1FTJ structure. The memory cells are used to form a memory array that is used in analog computing for AI/ML applications.

FIG. 1 illustrates a cross-sectional view of a ferroelectric film 250 with random polarization directions, in an embodiment. The ferroelectric (FE) film 250 has a plurality of grains (e.g., particles), such as grains 201A, 201B, and 201C, which grains are formed in one or more layers of grains of the FE film 250. The grains (e.g., 201A, 201B, and 201C) may be collectively referred to as grains 201 for ease of description herein.

As illustrated in FIG. 1, each of the grains 201 has a random polarization direction (illustrated as an arrow within each grain) such that the grains in the FE film 250 have many different polarization directions. The grains of the FE film 250 may also have different sizes (referred to as grain sizes). The FE film 250 (which has non-uniform polarization directions) differs from an FE film having a uniform polarization direction, where the polarization directions of all the grains in the FE film are along a same or similar direction. For ease of discussion, the FE film having a uniform polarization direction may be referred to as a uniform FE film hereinafter.

For a uniform FE film with the same polarization direction and coercive field ($E_c$) for all of the grains, each of the grains has two possible polarization directions that are opposite to each other, and the polarization directions of all the grains are aligned (e.g., parallel to each other). When an electrical field applied to this uniform FE film has an effective field along the polarization direction higher than the $E_c$ of the uniform FE film, the polarization directions of all the grains in this uniform FE film are switched to a first direction. Similarly, when the electrical field applied to this uniform FE film has an effective field along the polarization direction smaller than, e.g., $-E_c$, the polarization directions of all the grains in the uniform FE film switch to a second direction opposite the first direction. The polarization switching characteristic of the uniform FE film has a hysteresis loop and may have a shape similar to one of the Q-V curves in FIG. 2B (see description below). Since this uniform FE film only has two different (e.g., opposite) possible polarization directions, devices built using the uniform FE film may only have two different states. For example, a ferroelectric field-effect transistor (FeFET) built using the uniform FE film may only has two different threshold voltage values, each corresponding to a polarization state. As another example, a ferroelectric tunnel junction (FTJ) built using the uniform FE film may only has two different tunneling electroresistance (TER) values, each corresponding to a polarization state of the uniform FE film.

For the FE film 250 of FIG. 1, each of the grains of the FE film 250 has two possible polarization directions that are opposite to each other, and the polarization direction of each grain may be random (e.g., uncorrelated with the polarization direction of another grain). When an electric field is applied, e.g., along the thickness T direction, the effective electric field along a direction parallel to each grain's polarization direction is different. For ease of discussion, the effective electric field along a direction parallel to a grain's polarization direction is simply referred to as the effective electric field of the grain. One skilled in the art will readily appreciate that the effective electric field of each grain may be calculated by performing a vector decomposition of the electric field applied.

Due to the random polarization directions of the grains of the FE film 250, as the electric field applied along the thickness T direction gradually increases over time, the effective electrical fields of each of the grains may exceed its respective coercive fields at different time, and as a result, the polarization direction of each of the grains may switch to its respective first direction at a different time. Similarly, when the electric field decrease gradually over time, the polarization direction of each of the grains may switch to its respective second direction at a different time. Therefore, when viewed as a whole, the FE film 250 has a plurality of different states (e.g., more than two different states) that corresponds to the plurality of polarization direction switching in the FE film 250. In other words, the FE film 250 has a plurality of different states that can be set (e.g., programmed) using a gradually (e.g., continuously) increasing and/or a gradually (e.g., continuously) decreasing electric field (or electric voltage). The plurality of different states of the FE film 250 may be advantageously used to form analog NVM synapse suitable for analogy computing for AI/ML applications, as discussed in more details below.

Figure 2C:
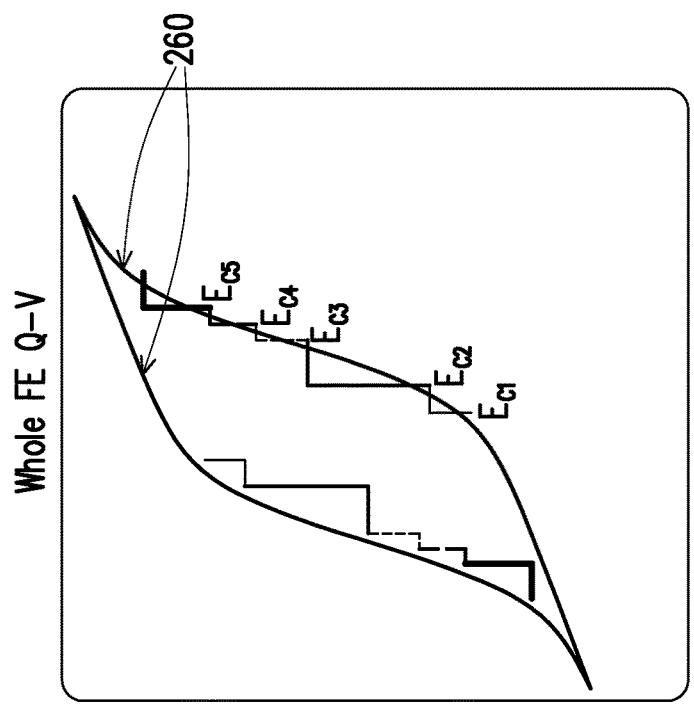
FIGS. 2A, 2B, and 2C illustrate the switching characteristics of the ferroelectric film of FIG. 1, in an embodiment.
Figure 2B:
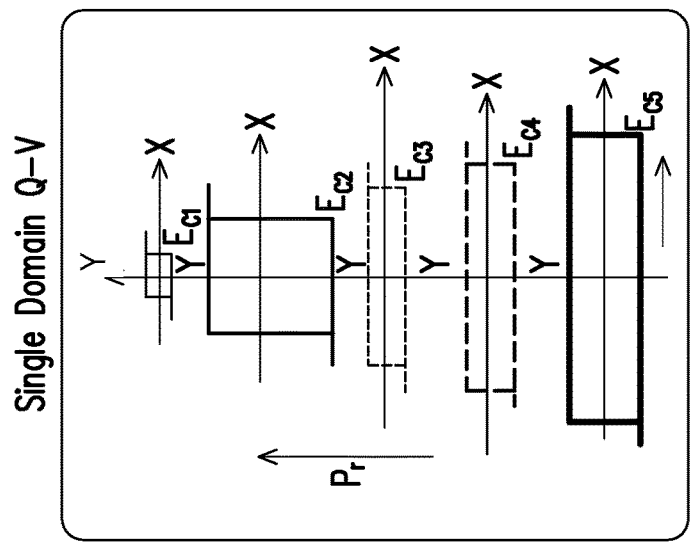
Figure 2A:
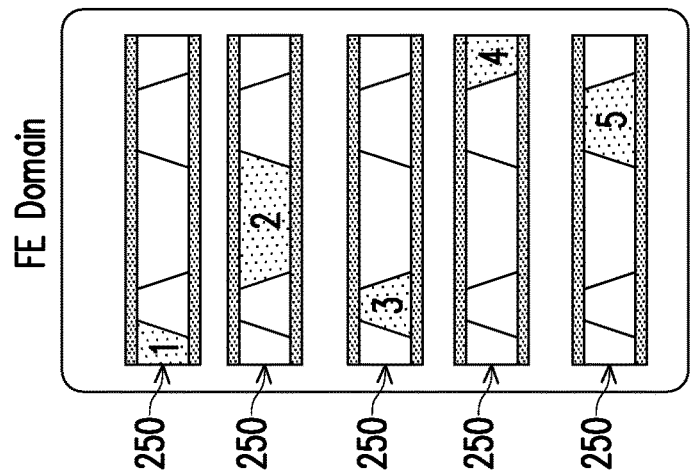

FIGS. 2A, 2B, and 2C illustrate the polarization switching characteristics of the ferroelectric film 250 of FIG. 1, in an embodiment. In FIG. 2A, the FE film 250 is illustrated as having five grains labeled with numerals 1, 2, 3, 4, and 5. The number of grains illustrated in FIG. 2A is merely an example, and the FE film 250 may have any suitable number of grains. The five subplots (each in a different row) in FIG. 2A show the same FE film 250, but in each subplot, a different grain is labeled with a different numeral. The five subplots (each in a different row) in FIG. 2B illustrate five Q-V curves for the five different grains of the FE film 250, where each Q-V curve corresponds to a respective labeled grain in a same row in FIG. 2A. FIG. 2C shows a combined Q-V curve for the FE film 250 when contributions from all the grains (e.g., 1, 2, 3, 4, and 5) are considered. One skilled in the art will readily appreciate that for each Q-V curve in FIG. 2B, the X-axis shows the electric field applied to the FE film 250 along the thickness (see T in FIG. 1) direction of the FE film 250, and the Y-axis shows the direction and the strength of the remnant polarization of the grain along the thickness direction. Note that each of the Q-V curves has a hysteresis loop around the origin (e.g., (0,0) location) of its respective X-Y coordinate.

The effective coercive field of each of the grains of the FE film 250 may be determined by the grain size and/or each grain's polarization direction. Here the effective coercive field of a grain refers to a value of the electric field along the thickness T direction that causes the polarization direction of the grain to switch. As illustrated in FIG. 2B, the Q-V curves of the grains have similar shapes, but the effective coercive fields (e.g., $E_{c1}$, $E_{c2}$, $E_{c3}$, $E_{c4}$, and $E_{c5}$) for different grains are different. Therefore, each grain switches its polarization direction (also referred to as polarization orientation) when the electric field (which may be proportional to the voltage applied) along the thickness T direction crosses its corresponding effective coercive field. For example, looking at the first Q-V curve of FIG. 2B, when the electric field applied increases above $E_{c1}$, the first grain switches from a second polarization direction to a first polarization direction; when the electric field applied decrease below, e.g., $-E_{c1}$, the first grain switches from the first polarization direction back to the second polarization direction. Note that in FIG. 2B, for each grain, the strength (e.g., magnitude) of the remnant polarization along the thickness T direction may be different, due to the different polarization direction of each grain.

FIG. 2C shows the Q-V curve of the FE film 250, when the Q-V curves of all the grains are combined together. The shape of the combined Q-V curve has many stairs (e.g., step changes), where the locations of the stairs along the X-axis correspond to the effective coercive fields of the different grains. For example, as the electric field applied to the FE film 250 gradually increases past the effective coercive fields $E_{c1}$, $E_{c2}$, $E_{c3}$, $E_{c4}$, and $E_{c5}$, the grains 1, 2, 3, 4, and 5 sequentially switch their polarization directions to their respective first directions (which may be uncorrelated with each other), and as a result, the overall remnant polarization of the FE film 250 (with contributions from all the grains) shows step increases at the effective coercive fields $E_{c1}$, $E_{c2}$, $E_{c3}$, $E_{c4}$, and $E_{c5}$. In other words, the combined Q-V curve has multiple (e.g., >2) polarization switching points along the X-axis, and therefore, the polarization strength (e.g., magnitude) has multiple values which are beneficial for use as analog NVM synapse. In the example of FIG. 2C, the FE film 250 has 10 different states, each corresponding to a polarization direction switching point (or an effective coercive field).

The curves 260 in FIG. 2C show an approximation of the combined Q-V responses of all the grains. One skilled in the art will readily appreciate that as the number of grains in the FE film 250 increases, the number of polarization direction switching points (e.g., number of different effective coercive fields) increases, and the curve 260 more closely approximates the combined Q-V curves. In other words, by having larger numbers of grains with random polarization directions, the FE film 250 may have a smooth, continuous Q-V response that is beneficial for use as non-volatile memory synapse.

Figure 3:
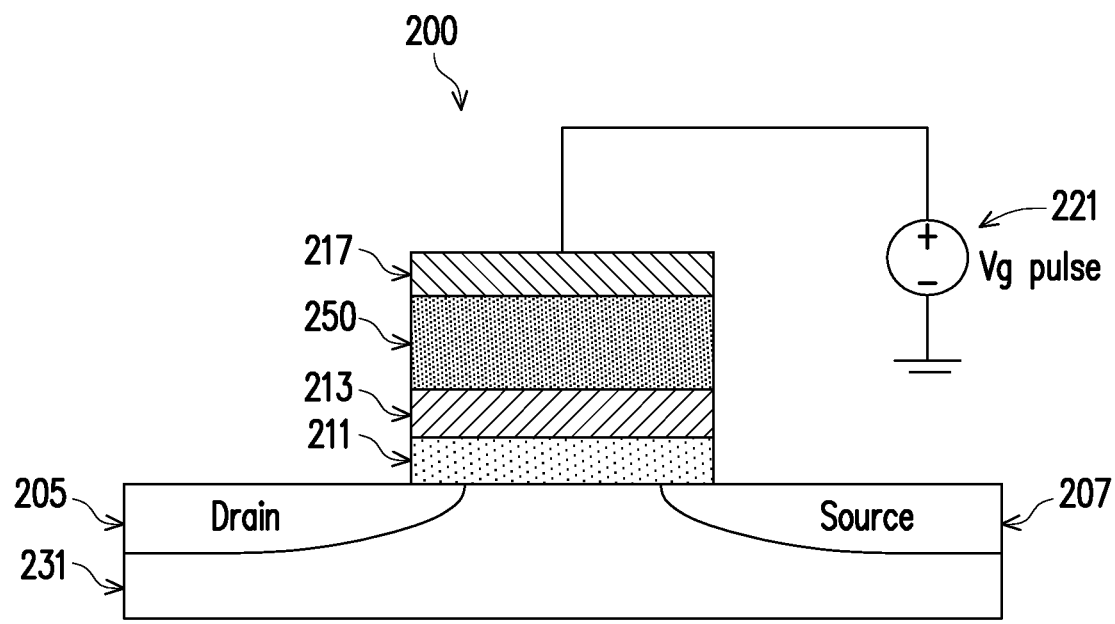
FIG. 3 illustrates a cross-sectional view of a ferroelectric field-effect transistor (FeFET), in an embodiment.

FIG. 3 illustrates a cross-sectional view of a ferroelectric field-effect transistor (FeFET) 200, in an embodiment. The FeFET 200 includes a substrate 231, which may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Source region 207 and drain region 205 (may be collectively referred to as the source/drain regions) are formed in the substrate 231 on opposing sides of a gate structure, which gate structure includes a gate dielectric layer 211, an internal metal layer 213, the ferroelectric film 250, and a gate electrode 217 formed successively over the substrate 231. The FeFET 200 may be referred to as an MFMIS FET, wherein MFMIS represents the materials of the different layers of the FeFET 200. For example, the first M stands for the metal material of the gate electrode 217, F stands for the ferroelectric material of the ferroelectric film 250, the second M stands for the metal material of the internal metal layer 213, I stands for the dielectric material of the gate dielectric layer 211, and S stands for the substrate material of the substrate 231.

The source region 207 and the drain region 205 may be formed by doping areas of the substrate 231 with an N-type dopant, such as arsenic or phosphorus, for an N-type device, or by doping areas of the substrate 231 with a P-type dopant, such as boron, for a P-type device. The gate dielectric layer 211 may be formed of a suitable dielectric material, such as silicon oxide, silicon nitride (SiN), a high-K dielectric material with a dielectric constant (K value) larger than 3.9 (e.g., between about 3.9 and about 25), or the like, and may be formed by a suitable formation method such as chemical vapor deposition (CVD), physical vapor deposition (PVD), atomic layer deposition (ALD), combinations thereof, or the like.

The internal metal layer 213 is formed of a metal or a metal-containing material, such as titanium nitride (TiN), tantalum nitride (TaN), tungsten (W), or copper (Cu), using a suitable formation method such as CVD, PVD, or ALD. In some embodiments, the ferroelectric film 250 is a doped hafnium oxide ($HfO_2$) film, such as $HfO_2$ film doped with silicon (Si), aluminum (Al), zirconium (Zr), gadolinium (Gd), or yttrium (Yt). For example, the doped hafnium oxide may be a hafnium oxide doped with zirconium, where the atomic percentage ratio between Hf, Zr, and O is about 1:1:4. As another example, the doped hafnium oxide may be a hafnium oxide doped with aluminum, where the atomic percentage (at %) of aluminum is about 10 at % or less, such as about 10%.

In some embodiments, the FE film 250 is formed using atomic layer deposition (ALD) at a temperature of about 250° C. In some embodiments, a doped $HfO_2$ film is formed using ALD, with the dopant (e.g., Si, Al, Zr, Gd, or Yt) formed in some cycles of the ALD process over a monolayer of oxygen (O) formed in a previous ALD cycle. In an ALD process for forming an un-doped $HfO_2$ film, monolayers of Hf and monolayers of O are formed alternately in alternating deposition cycles (also referred to as cycles) of the ALD process. To form the doped $HfO_2$ film, some deposition cycles for forming Hf monolayers in the un-doped ALD process are replaced with deposition cycles for forming the dopant (e.g., of Si, Al, Zr, Gd, or Yt) monolayers. For example, some monolayers of Hf are replaced by monolayers of a dopant Zr, and therefore, the doped $HfO_2$ film (e.g., doped by Zr) may comprise repetitions of the following monolayer structure: a first O monolayer, an Hf monolayer over (e.g., in direct contact with) the first O monolayer, a second O monolayer over (e.g., in direct contact with) the Hf monolayer, and a Zr monolayer over (e.g., in direct contact with) the second O monolayer.

A thickness T (see FIG. 1) of the ferroelectric film 250 is between about 5 nm and about 20 nm, in some embodiments. If the thickness T is smaller than about 5 nm, the grains of the doped $HfO_2$ film formed tend to have a uniform polarization direction instead of random polarization directions, and therefore, do not provide the multiple-step Q-V response illustrated in FIG. 2C. On the other hand, if the thickness T is larger than 20 nm, the FE film 250 may be too thick for advanced process technologies suitable for AI/ML hardware implementation.

In some embodiments, each grain of the FE film 250 comprises doped $HfO_2$. After the FE film 250 is formed, the gate electrode 217 is formed over the FE film 250, and a thermal anneal process is performed at a temperature between about 500° C. and about 600° C. The gate electrode 217 may comprise a metal or a metal-containing material, such as TiN, TaN, W, Cu, or the like, and may be formed using a suitable formation method, such as CVD, PVD, or ALD. The gate electrode 217 is formed of a same material as the internal metal layer 213, in some embodiments. In other embodiments, the gate electrode 217 is formed of a different material than the internal metal layer 213. In some embodiments, the as-deposited FE film 250 after the ALD process is amorphous, and after the anneal process discussed above, the FE film 250 is crystalized to form a poly-crystal FE film 250. Without being limited to a particular theory, it is believed that the dopant in the doped $HfO_2$ film helps to form the poly-crystal FE film 250 with random polarization directions.

FIG. 3 further illustrates a programming voltage 221 (which may comprise a plurality of voltage pulses with gradually increasing or gradually decreasing voltages) for the FeFET 200. During programming, the source region 207 and the drain region 205 are coupled to electrical ground (e.g., grounded), and the programming voltage 221 applies a voltage (e.g., a sequence of voltage pulses) to the gate electrode 217, in some embodiments. Recall that in FIG. 2C, the Q-V curve has multiple polarization direction switching points corresponding to different effective coercive fields (which are proportional to the programming voltage 221 applied). Therefore, depending on the voltage Vg of the programming voltage 221, the direction and strength of the remnant polarization of the FE film 250 may have different values. Consider an example where the FeFET 200 is an NMOS FET, and the programming voltage 221 is a sequence of voltage pulses with a gradually increasing positive voltage. As the voltage Vg increases, the strength of the remnant polarization of the FE film 250 increases, which attracts more electrons to the channel region of the FeFET 200, thereby causing a drop in the threshold voltage Vt of the FeFET 200. By changing the programming voltage 221, the threshold voltage Vt of the FeFET 200 is set (e.g., programmed) to different values, in some embodiments. Due to the plurality of effective coercive fields (see, e.g., FIG. 2C) of the FE film 250, the FeFET 200 has a plurality of (e.g., more than two) different programmable threshold voltage values.

After the threshold voltage Vt of the FeFET 200 is set (e.g., programmed), when a voltage V (e.g., a read voltage in a memory device) is applied to the gate electrode 217 of the FeFET 200, the current flowing between the source region 207 and the drain region 205 (referred to as source drain current) of the FeFET 200 is proportional to V-Vt, in some embodiments. In other words, the conductance (e.g., inverse of electrical resistance) between the source region 207 and the drain region 205 of the FeFET 200 may be adjusted by adjusting the threshold voltage Vt, which is programmed by the programming voltage 221. Therefore, the FeFET 200 may be functionally considered as a three-terminal adjustable resistor, where electrical current flows between the source region 207 and the drain region 205, and the gate electrode 217 is used to adjust the electrical resistance (or the conductance) of the resistor. For ease of discussion herein, the conductance between the source region 207 and the drain region 205 of the FeFET 200 may also be referred to as the effective conductance of the FeFET 200, or simply the conductance of the FeFET 200. Due to the plurality of effective coercive fields (see, e.g., FIG. 2C) of the FE film 250, the FeFET 200 has a plurality of (e.g., more than two) different programmable effective conductance values.

Figure 4:
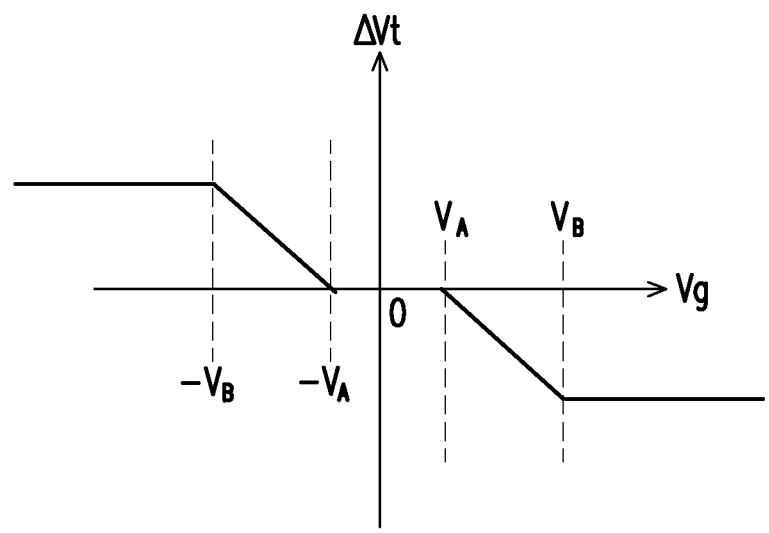
FIG. 4 illustrates the change of the threshold voltage versus the programming voltage for the FeFET of FIG. 3, in an embodiment.

FIG. 4 illustrates the change of the threshold voltage Vt (labeled ΔVt) versus the programming voltage Vg for the FeFET 200 of FIG. 3, in an embodiment. FIG. 4 illustrates an example where the FeFET 200 is an N-type device. As illustrated in the FIG. 4, as Vg increases gradually from zero and passes a minimum value $V_A$ (which may correspond to a lowest positive effective coercive field similar to the first effective coercive field $E_{c1}$ in FIG. 2C), the threshold voltage Vt starts to decrease from an initial value over a range of Vg values (e.g., a range between $V_A$ and $V_B$). When Vg reaches the voltage $V_B$ (which may correspond to a highest positive effective coercive field of the FE film 250), the threshold voltage Vt reaches a minimum value and stops decreasing. Similarly, by applying a decreasing negative programming voltage Vg, the threshold voltage Vt increases over a range of Vg values (e.g., the range between $-V_A$ and $-V_B$). The gradual, continuous, and substantially linear change in the threshold voltage Vt illustrated in FIG. 4 is especially beneficial for forming analog NVM synapse. In contrast, a uniform FE film may only have one positive coercive field $E_{c1}$, and therefore, the change of threshold voltage Vt versus Vg curve may exhibit one abrupt step change for positive Vg values. For this reason, non-volatile memory devices formed using the FeFET 200 may be referred to as analog non-volatile memory devices, due to the analog-like Q-V response (see FIG. 2C) and/or ΔVt versus Vg relation.

Figure 5:
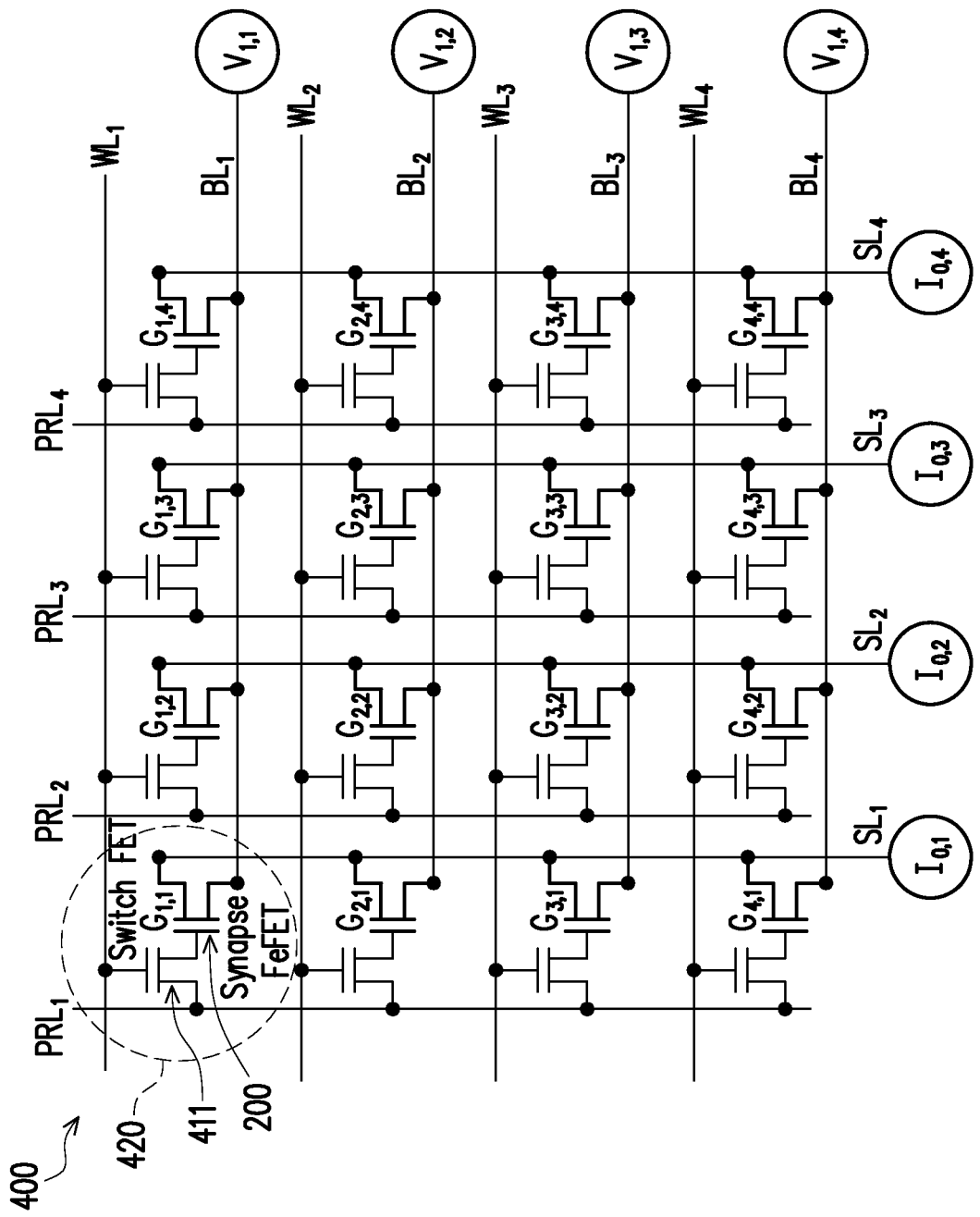
FIG. 5 illustrates a schematic view of a memory array formed using FeFETs, in an embodiment.

FIG. 5 illustrates a schematic view of a memory array 400 built using the FeFET 200, in an embodiment. The memory array 400 of FIG. 5 is a 4×4 array formed with sixteen 1T1FeFET analog non-volatile memory cells, where T stands for transistor, and FeFET stands for ferroelectric field-effect transistor. The size (e.g., 4×4) of the memory array 400 shown in FIG. 5 is a non-limiting example. One skilled in the art will readily appreciate that the memory array may have any other dimensions.

In FIG. 5, each FeFET 200 is connected to a respective transistor 411 (also referred to as a switching transistor, or a switching FET) to form a memory cell. For example, the dashed circle in FIG. 5 illustrates a memory cell 420. For each memory cell 420, a source of the switching transistor 411 is connected to a gate of the FeFET 200. FIG. 5 further illustrates bit lines BL1, BL2, BL3, and BL4, and word lines WL1, WL2, WL3, and WL4. Each of the bit lines is connected to the drains of respective FeFETs 200. For example, the bit line BL1 is connected to the drains of four FeFETs 200 disposed in the top row of the memory array in FIG. 5. Each of the word lines is connected to the gates of respective switching transistors 411. For example, the word line WL1 is connected to the gates of four switching transistors 411 disposed in the top row of the memory array in FIG. 5. In addition, FIG. 5 illustrates programming lines PRL1, PRL2, PRL3, and PRL4, and output lines SL1, SL2, SL3, and SL4. Each of the programming lines is connected to the drains of respective switching transistors 411, and each of the output lines is connected to the sources of respective FeFET 200. For example, the programming line PRL1 is connected to the drains of four switching transistor 411 disposed in a same column (e.g., the leftmost column) of the memory array of FIG. 5, and the output line SL1 is connected to the sources of the four FeFET 200 disposed in a same column (e.g., the leftmost column) of the memory array of FIG. 5.

As discussed above, the conductance of the FeFET 200 in each memory cell can be programmed to a different value through the programming voltage. The conductance of the FeFET 200 in each memory cell of FIG. 5 may serve as an element (e.g., a coefficient) in a 4×4 matrix that is used to implement the Multiply-Accumulate (MAC) operations in analog computing. An example is discussed below to demonstrate how the FeFET 200 is used as analog NMV synapse in analog computing.

Consider an example where the conductance of each FeFET 200 is programmed to a different value $G_{i,j}$, wherein i and j denotes the row number and the column number in the memory array at which the FeFET 200 is located. For example, the four FeFETs 200 at the first row of the memory array 400 have conductances $G_{1,1}$, $G_{1,2}$, $G_{1,3}$, and $G_{1,4}$. A weight update operation may be performed to program the conductances of the FeFETs 200. In the weight update operation, to program the conductance $G_{i,j}$ of the FeFET 200 located on the i-th row and j-th column, a high voltage is applied at the word lines WLi to turn on the switching transistors 411 in the i-th row, and a programming voltage (e.g., a sequence of gradually increasing or gradually decreasing voltage pulses) is applied at the programming line PRLj to set (e.g., program) the conductance $G_{i,j}$ of the FeFET 200 on the i-th row and j-th column. Note that the example here assumes that the switching transistor 411 is an N-type device, thus a high voltage (e.g., +3V, +5V) is used to turn on the switching transistor 411.

After the conductances of all the FeFETs 200 in the memory array 400 are programmed, the analog computing is performed by an inference operation. In the inference operation, a high voltage is applied to all of the word lines WL1, WL2, WL3, and WL4 to turn on all of the switching transistors 411. Next, a read voltage, which may be a fixed voltage (e.g., +0.2V, +0.3V) that is slightly higher than, e.g., the largest threshold voltage of the FeFETs 200, is applied to all the program lines PRL1, PRL2, PRL3, and PRL4, such that the read voltage is applied to the gates of all the FeFET 200. Input voltages $V_{I,1}$, $V_{I,2}$, $V_{I,3}$, and $V_{I,4}$ are applied to the bit lines BL1, BL2, BL3, and BL4, respectively. The current measured at the lower ends (see the ends with labels $I_{o,1}$, $I_{o,2}$, $I_{o,3}$, and $I_{o,4}$) of the output lines SL1, SL2, SL3, and SL4 is given by $$I_{o,j} = \sum_{k=1}^{4} G_{j,k} V_{I,k} \quad (1)$$

where j=1, 2, 3, or 4. Note that the output currents measured at the lower ends of the each output line (e.g., SL1, SL2, SL3, or SL4) automatically achieves the multiply-and-accumulate operations in Equation (1). In particular, by functioning as a programmable resistor, each FeFET 200 converts a respective input voltage (e.g., $V_{I,1}$, $V_{I,2}$, $V_{I,3}$, or $V_{I,4}$) into a respective output current, thereby achieving the multiply operations in Equation (1) without using digital multipliers. In addition, the source drain currents of all the FeFET 200 disposed on a same column of the memory array are naturally added together, as dictated by the Kirchhoff's Current Law, thereby achieving the accumulate operations without using digital adders. Therefore, the MAC operations in Equation (1) are achieved by using the analog properties of the devices (e.g., as dictated by physics laws) in the memory array.

Additional embodiments of analog NVM synapse formed using the FE film 250 are disclosed hereinafter. In particular, ferroelectric tunnel junctions (FTJs) built using the FE film 250 and non-volatile memory devices built using such FTJs are disclosed.

FTJ is a two-terminal device and may be formed by sandwiching a ferroelectric film between two electrically conductive layers (e.g., a top electrode and a bottom electrode), where the two electrically conductive layers function as the two terminals of the FTJ device. The electrical polarization direction of the ferroelectric film can be switched by an electric field applied to the ferroelectric film. The electrical resistance of the FTJ, also referred to as the tunneling electroresistance (TER) of the FTJ, is determined by the orientation of the electric polarization of the ferroelectric film. For example, for a conventional FTJ having a ferroelectric film with a uniform polarization direction, by changing the electrostatic potential (e.g., voltage) profile across the ferroelectric film, the FTJ may change from a high-resistance state (HRS) to a low-resistance state (LRS), or vice versa. Since the ferroelectric film 250 of the present disclosure has many different polarization direction switching points (see, e.g., FIG. 2C), the TER of the FTJ formed using the ferroelectric film 250 in the present disclosure has many different values that are programmable by applying different programming voltages. For example, the TER may be set (e.g., programmed) by a programming voltage with a gradually increasing or gradually decreasing voltage.

Figure 6A:
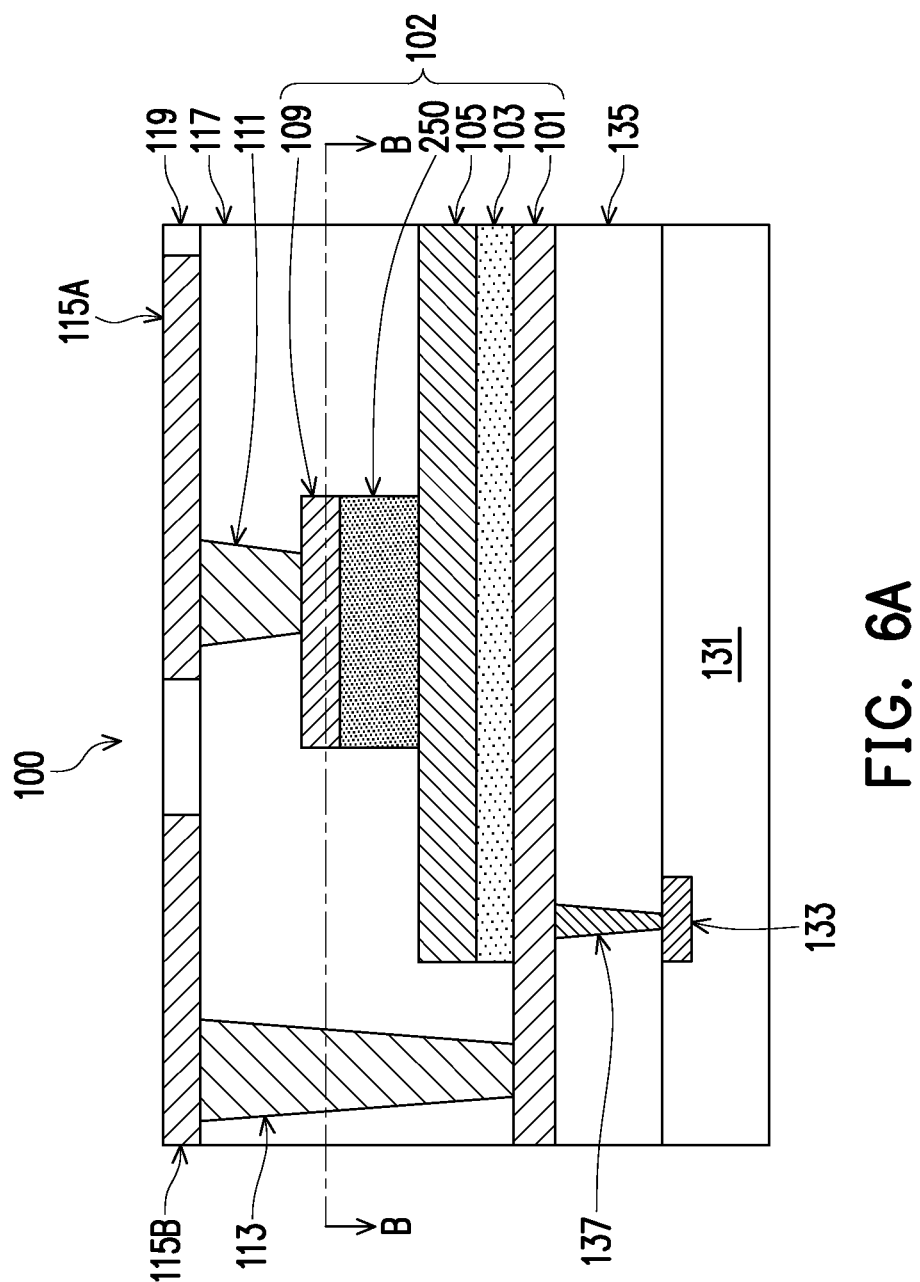
FIGS. 6A and 6B illustrate cross-sectional views of a device comprising a ferroelectric tunnel junction (FTJ), in an embodiment.
Figure 6B:
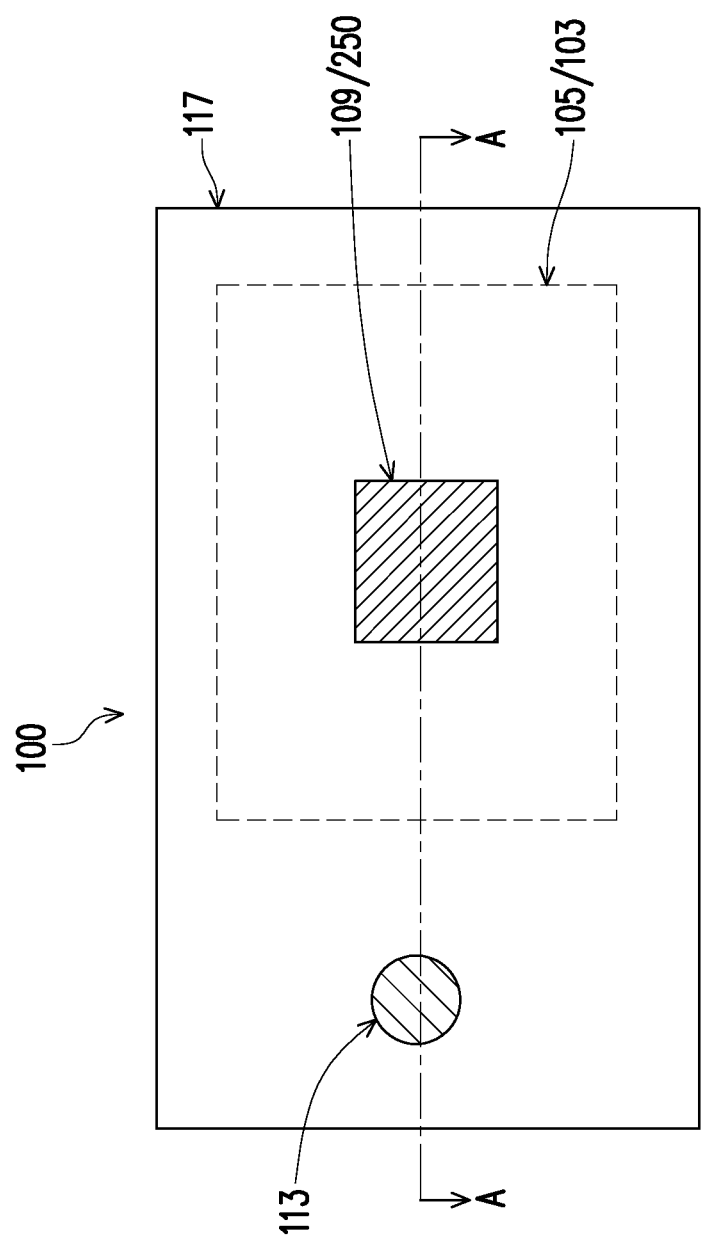

FIGS. 6A and 6B illustrate cross-sectional views of a device 100 comprising a ferroelectric tunnel junction (FTJ) 102, in an embodiment. FIG. 6B illustrates the cross-sectional view of the device 100 along cross-section B-B in FIG. 6A, and FIG. 6A illustrates the cross-sectional view of the device 100 along cross-section A-A in FIG. 6B. Note that for clarity, not all features of the device 100 are illustrated in FIGS. 6A and 6B, and FIGS. 6A and 6B may illustrate only a portion of the device formed. In addition, to illustrate the relationship (e.g., locations, sizes) between different features of the device 100, some features (e.g., 105, 103) that are not visible along the cross-section B-B are also illustrated in FIG. 6B in dashed lines.

Referring to FIG. 6A, the device 100 includes a substrate 131, a dielectric layer 135 over the substrate 131, an FTJ 102 over the dielectric layer 135, dielectric layers 117 and 119 over the dielectric layer 135, vias 111/113, and conductive lines 115A/115B. The FTJ 102 includes a bottom electrode 101 (may also be referred to as a bottom metal layer), a dielectric layer 103, an internal metal layer 105 (also referred to as an internal gate), the ferroelectric film 250 (also referred to as a ferroelectric layer), and a top electrode 109 (also referred to as a top metal layer).

FIG. 6A further illustrates a conductive feature 133 formed in or on the substrate 131. In the illustrated embodiment, the conductive feature 133 is a transistor that is electrically coupled to the bottom electrode 101 of the FTJ 102 by a via 137. In the example of FIG. 6A, the via 137 extends through the dielectric layer 135 and electrically couples the bottom electrode 101 to a drain of the transistor 133. The device 100 may therefore be a memory cell of a memory device (e.g., a non-volatile memory device) with a 1T1FTJ structure, where T stands for transistor, and FTJ stands for ferroelectric tunnel junction. Details of the device 100 and method of forming the device 100 are discussed hereinafter.

The substrate 131 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors 133, diodes, capacitors, resistors, etc., may be formed in and/or on the substrate 131 and may be interconnected by interconnect structures formed by, for example, metallization patterns in one or more dielectric layers over the substrate 131. FIG. 6A may only illustrate a portion of the device that includes the FTJ 102 and the transistor 133.

The dielectric layer 135, which may be an interlayer dielectric (ILD) layer, is formed over the substrate 131. The dielectric layer 135 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof, and may be formed, for example, by spin coating, lamination, chemical vapor deposition (CVD), or the like. Next, the via 137 is formed in the dielectric layer 135 to electrically couple to, e.g., a drain of the transistor 133. The via 137 may be formed by forming an opening in the dielectric layer 135 and filling the opening with an electrically conductive material (e.g., copper, tungsten, or the like).

Next, the bottom electrode 101 is formed over the dielectric layer 135. The bottom electrode 101 is formed of an electrically conductive material. In the example of FIG. 6A, the bottom electrode 101 is formed of a metal or a metal-containing material, such as copper (Cu), tungsten (W), titanium nitride (TiN), tantalum nitride (TaN), or the like. A thickness of the bottom electrode 101 may be between about 5 nm and about 30 nm, as an example. A suitable formation method, such as atomic layer deposition (ALD), may be used to form the bottom electrode 101.

Next, the dielectric layer 103 and the internal metal layer 105 are formed over the bottom electrode 101 successively. The dielectric layer 103 is a silicon oxide layer, in some embodiments. In some embodiments, the dielectric layer 103 is formed of a high-K dielectric material having a dielectric constant (K) value larger than 3.9, such as between about 3.9 and about 25. Examples of the high-K dielectric material include hafnium oxide (e.g., HfO2), zirconium oxide (e.g., ZrO2), silicon nitride (e.g., SiN), and lanthanum oxide (e.g., La2O3). A thickness of the dielectric layer 103 is less than about 2 nm, such as about 1 nm, in some embodiments. A suitable deposition method, such as ALD, may be used to form the dielectric layer 103.

The internal metal layer 105 is formed of an electrically conductive material (e.g., Cu, W, TiN, TaN), and may be formed of a same material or a different material as the bottom electrode 101. A suitable deposition method, such as ALD, may be used to form the internal metal layer 105. A thickness of the internal metal layer 105 is between about 5 nm and about 30 nm, in some embodiments.

Next, the dielectric layer 103 and the internal metal layer 105 are patterned using, e.g., a same patterning mask. In other words, a single patterning process is used to pattern both the dielectric layer 103 and the internal metal layer 105, in some embodiments. An anisotropic etching process, such as a plasma etching process, may be used to pattern the dielectric layer 103 and the internal metal layer 105. The patterning process removes portions of the dielectric layer 103 and portions of the internal metal layer 105, and exposes portions of the bottom electrode 101. After the patterning process, remaining portions of the dielectric layer 103 and remaining portions of the internal metal layer 105 have a same size (e.g., same length, width, and surface area), as illustrated in FIGS. 6A and 6B. For example, as shown in FIG. 6B, the internal metal layer 105 and the dielectric layer 103 have a same surface area in a top view, thus their boundaries (e.g., sidewalls) overlap completely.

Referring back to FIG. 6A, after the dielectric layer 103 and the internal metal layer 105 are patterned, the ferroelectric layer 250 and the top electrode 109 are formed successively over the internal metal layer 105. The material and the formation method of the ferroelectric layer 250 of the device 100 is the same as or similar to the ferroelectric film 250 of the FeFET 200 discussed above, thus details may not be repeated. For example, the ferroelectric layer 250 is formed of a suitable ferroelectric material, such as doped hafnium oxide. The doped hafnium oxide may be a hafnium oxide doped by Si, Al, Zr, Gd, or Yt. As an example, the doped hafnium oxide may be a hafnium oxide doped with zirconium, where the atomic percentage ratio between Hf, Zr, and O is about 1:1:4. As another example, the doped hafnium oxide may be a hafnium oxide doped with aluminum, where the atomic percentage (at %) of aluminum is less than about 10 at %, such as about 10 at %. The ferroelectric layer 250 may have a thickness between about 5 nm to about 20 nm.

The top electrode 109 is formed of an electrically conductive material, such as Cu, W, TiN, TaN, or the like, and may be formed of a same material as the bottom electrode 101. In some embodiments, the top electrode 109 is formed of a different material than the bottom electrode 101. A thickness of the top electrode 109 is between about 10 nm and about 30 nm, in some embodiments. A suitable deposition method, such as ALD, may be used to form the top electrode 109.

After the top electrode 109 and the ferroelectric layer 250 are formed, the top electrode 109 and the ferroelectric layer 250 are patterned using, e.g., a same patterning mask. In other words, a single patterning process is used to pattern both the top electrode 109 and the ferroelectric layer 250, in some embodiments. An anisotropic etching process, such as a plasma etching process, may be used to pattern the top electrode 109 and the ferroelectric layer 250. The patterning process removes portions of the top electrode 109 and portions of the ferroelectric layer 250, and exposes portions of the internal metal layer 105. After the patterning processing, remaining portions of the top electrode 109 and remaining portions of the ferroelectric layer 250 have a same size (e.g., same length, width, and surface area), as illustrated in FIGS. 6A and 6B. For example, as shown in FIG. 6B, the top electrode 109 and the ferroelectric layer 250 have a same surface area in the top view, thus their boundaries (e.g., sidewalls) overlap completely.

As illustrated in FIG. 6B, an area A1 of the top electrode 109 is smaller than an area A2 of the internal metal layer 105. In some embodiments, a ratio between the area A1 of the top electrode 109 and the area A2 of the internal metal layer 105 is between about 1/100 and about 1/5, such as about 1/30. In the discussion herein, the top electrode 109, the ferroelectric layer 250 and the internal metal layer 105 may be referred to as a first capacitor, where the top electrode 109 and the internal metal layer 105 are considered as the plates (e.g., top plate and bottom plate, respectively) of the first capacitor, and the ferroelectric layer 250 is considered as the dielectric layer between the plates of the first capacitor. The area (e.g., plate area) of the first capacitor is determined by the area of the top electrode 109, and therefore, is A1. The top electrode 109, the ferroelectric layer 250, and the internal metal layer 105 may be collectively referred to as an MFM structure or an MFM capacitor, where M stands for the metal material (e.g., of layer 109 or layer 105), and F stands for the ferroelectric material (e.g., of layer 250).

Similarly, the internal metal layer 105, the dielectric layer 103, and the bottom electrode 101 may be referred to as a second capacitor, and the area (e.g., plate area) of the second capacitor is determined by the area of the internal metal layer 105, and therefore, is A2. The internal metal layer 105, the dielectric layer 103, and the bottom electrode 101 may be collectively referred to as an MIM structure or an MIM capacitor, where M stands for metal material (e.g., of layer 105 or layer 101), and I stands for dielectric material (e.g., of layer 103). The FTJ 102 of FIG. 6A, therefore, may be referred to as an MFMIM FTJ or an MFMIM structure. The FTJ 102 is a two-terminal device, with the bottom electrode 101 and the top electrode 109 functioning as the two terminals of the FTJ 102.

Still referring to FIG. 6A, next, a dielectric layer 117, such as SiO2, SiN, a low-K dielectric material, or the like, is formed over the bottom electrode 101 and over the FTJ 102. A suitable deposition method, such as CVD, PVD, or the like, may be used to form the dielectric layer 117. A via 111 is formed to extend from an upper surface of the dielectric layer 117 into the dielectric layer 117, and to electrically couple to the top electrode 109. Another via 113 is formed to extend from the upper surface of the dielectric layer 117 into the dielectric layer 117, and to electrically couple to the bottom electrode 101.

Next, a dielectric layer 119 is formed over the dielectric layer 117, and conductive lines 115A and 115B (e.g., copper lines) are formed in the dielectric layer 119. The dielectric layer 119 may comprise a same or similar material as the dielectric layer 117, and may be formed using a same or similar formation method, thus details are not repeated. The conductive lines 115A and 115B may be formed using any suitable method, such as a damascene process. In some embodiments, the conductive lines 115A/115B and the vias 111/113 are formed together in a dual-damascene process, in which case the dielectric layers 117 and 119 may be formed together as one layer. In the example of FIG. 6A, the conductive lines 115A and 115B are electrically coupled to the vias 11 and 113, respectively. The conductive lines 115A and 115B provide electrical connection to the two terminals (e.g., top electrode 109 and bottom electrode 101) of the FTJ 102. In some embodiments, since the bottom electrode 101 of the FTJ 102 is electrically coupled to, e.g., the drain of the transistor 133 through the via 137, and therefore, the via 113 and the conductive line 115B may be omitted.

Additional processing, such as formation of additional dielectric layers and conductive features (e.g., vias, conductive lines) may be performed to finish fabrication of the device 100, as one skilled in the art readily appreciates, thus details are not discussed herein. In addition, for clarity, not all features of the device 100 are illustrated in FIGS. 6A and 6B. For example, electrical connections to the gate and the source of the transistor 133, as well as other components (e.g., other transistors, resistors, diodes, capacitors, inductors, or the like) of the device 100 and their electrical connections, are not illustrated in FIGS. 6A and 6B.

The rectangular shapes of the various layers (e.g., 109, 250, 105, 103) of the FTJ 102 illustrated in FIG. 6B are non-limiting examples. Other shapes, such as square, circle, polygon, or the like, are also possible and are full intended to be included within the scope of the present disclosure.

The disclosed structure of the FTJ 102 (and other FTJs disclosed hereinafter) has many advantages. To appreciate the advantages, consider a reference FTJ which is similar to the FTJ 102 in FIG. 6A, but without the internal metal layer 105. In addition, the reference FTJ has a same size (e.g., same surface area in top view) for the top electrode 109, the ferroelectric layers 250, and the dielectric layer 103. Since a typical electric displacement field (D field) for switching the polarization direction of a ferroelectric layer is about 30 $\mu C/cm^2$, and since the structure of the reference FTJ results in a similar D field in the dielectric layer (e.g., 103), such a D field may cause breakdown of the dielectric layer, which typically has a breakdown D field of about 1 $\mu C/cm^2$. The breakdown of the dielectric layer in the FTJ may contribute to the poor endurance of certain FTJs.

In the disclosed embodiments, by having the internal metal layer 105, and by designing the area A1 of the top electrode 109 to be smaller than the area A2 of the internal metal layer 105, the breakdown of the dielectric layer 103 is alleviated or avoided (see discussion below), thus the endurance of the FTJ is improved.

With the internal metal layer 105 inserted between the top electrode 109 and the bottom electrode 101, the FTJ 102 may be considered as two capacitors coupled in series, where the two capacitors are: a first capacitor (e.g., an MFM capacitor) comprising the top electrode 109, the ferroelectric layer 250, and the internal metal layer 105, and a second capacitor (e.g., an MIM capacitor) comprising the internal metal layer 105, the dielectric layer 103, and the bottom electrode 101. The smaller area A1 of the top electrode 109 may result in the capacitance of the first capacitor being smaller than the capacitance of the second capacitor. Since the first capacitor and the second capacitor are coupled in series, one skilled in the art will readily appreciate that for a given voltage V applied between the top electrode 109 and the bottom electrode 101, the first capacitor (with smaller capacitance) experiences (e.g., shoulders) a larger voltage drop than the second capacitor. In other words, the first capacitor shoulders a larger percentage of the voltage V than the second capacitor, and as a result, the voltage drop across the second capacitor (e.g., between the internal metal layer 105 and the bottom electrode 101) is reduced. The reduced voltage drop in the second capacitor results in a reduced D field in the dielectric layer 103, which in turn reduces or prevents the breakdown of the dielectric layer 103.

In addition, since the ferroelectric layer 250 has pre-determined programming voltages (e.g., voltages to set or change the TER of the FTJ 102), and since the first capacitor shoulders a larger percentage of the voltage V (due to the smaller capacitance), a smaller voltage V applied across the FTJ 102 may be sufficient to provide the pre-determined programming voltages for the ferroelectric layer 250, e.g., compared with a reference design where the first capacitor and the second capacitor each share 50% of the voltage V. In other words, the disclosed embodiments allow for lower programming voltages V for the FTJ 102. The lower programming voltage V may advantageously reduce the power consumption of the FTJ 102 and/or the memory device formed using the FTJ 102.

The use of high-K dielectric material as the dielectric layer 103 further improves the performance of the FTJ 102. This is because for the same D field, the electrical field (E-field) in the dielectric layer 103 is inversely proportional to the K value of the dielectric layer 103. Therefore, a higher K value (due to the use of high-K dielectric material) results in a reduced E-field in the dielectric layer 103, which helps to prevent or reduce the breakdown of the dielectric layer 103. Note that a higher K value may result in a lower breakdown E-field for the dielectric layer 103. However, as long as the reduction in the E-field due to the use of high-K dielectric material is larger than the reduction in the breakdown E-field, using high-K dielectric material for the dielectric layer 103 provides performance gain (e.g., reduces breakdown of the dielectric layer 103).

Figure 7:
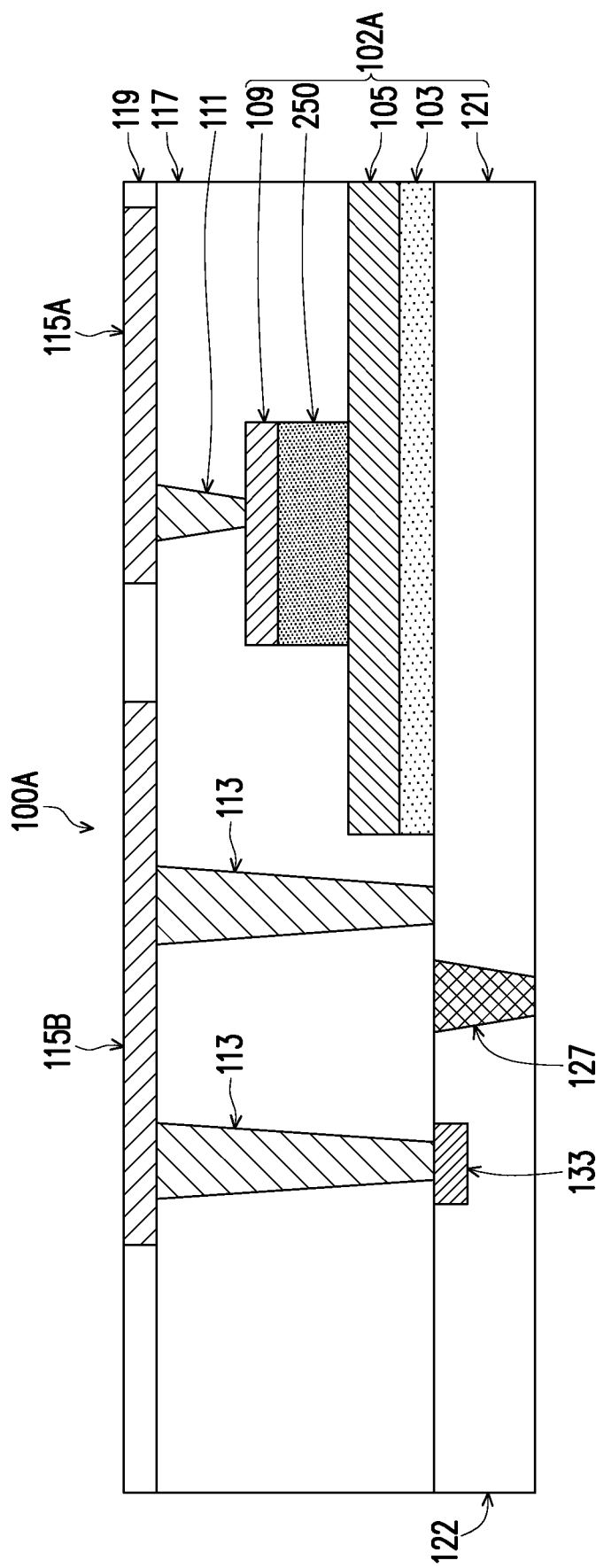
FIG. 7 illustrates a cross-sectional view of a device comprising an FTJ, in another embodiment.

FIG. 7 illustrates a cross-sectional view of a device 100A (e.g., a memory device) comprising an FTJ 102A, in an embodiment. For simplicity, not all features of the device 100A are illustrated. The FTJ 102A in FIG. 7 is similar to the FTJ 102 in FIG. 6A, but the bottom electrode of the FTJ 102A is a heavily doped substrate 121 instead of the metal or metal-containing material in FIG. 6A. In some embodiments, the heavily doped substrate 121 is a semiconductor substrate (e.g., silicon, silicon-germanium, germanium, or the like) doped by a dopant (e.g., boron, phosphorous, or arsenic). A concentration of the dopant may be between about $10^{19}$ cm$^{-3}$ and about $10^{21}$ cm$^{-3}$, as an example. Due to the dopant in the heavily doped substrate 121, the heavily doped substrate 121 is electrically conductive, in the illustrated embodiment. For example, an electrical resistivity of the heavily doped substrate 121 is between 0.1 mΩ-cm and about 10 mΩ-cm. A thickness of the heavily doped substrate 121 is between about 100 nm and about 100 m. In some embodiments, the heavily doped substrate 121 is a doped semiconductor layer over another substrate, or a doped top portion of a substrate.

FIG. 7 further illustrates an isolation region 127, such as a shallow trench isolation (STI) region, which separates the bottom electrode 121 from an active region 122 of the substrate. In addition, FIG. 7 illustrates a transistor 133 formed in the active region 122. The vias 113 and the conductive line 115B electrically couple the bottom electrode 121 of the FTJ 102A with the transistor 133. For example, the via 113 over the transistor 133 is electrically coupled to a drain of the transistor 133. Therefore, FIG. 7 illustrates portions of memory device (e.g., a memory cell) with a 1T1FTJ structure. The electrical connection between the transistor 133 and the FTJ 102A shown in FIG. 7 is merely an example, other electrical connections are also possible and are fully intended to be included within the scope of the present disclosure.

In FIG. 7, the top electrode 109, the ferroelectric layer 250 and the internal metal layer 105 form an MFM structure. The internal metal layer 105, the dielectric layer 103, and the heavily doped substrate 121 form an MIS structure, where M stands for metal, I stands for dielectric material, and S stands for substrate. The FTJ 102A may also be referred to as an MFMIS structure or an MFMIS FTJ.

Similar to the FTJ 102, the area A1 of the top electrode 109 of the FTJ 102A is smaller than the area A2 of the internal metal layer 105 of the FTJ 102A. In some embodiments, a ratio between the area A1 and the area A2 is between about 1/100 and about 1/5, such as about 1/30. Dimensions of other layers of the FTJ 102A are the same as or similar to those of the FTJ 102. For example, a thickness of the dielectric layer 103 in FIG. 7 is less than about 2 nm, such as 1 nm. A thickness of the ferroelectric layer 250 in FIG. 7 is between about 5 nm and about 20 nm.

Figure 8:
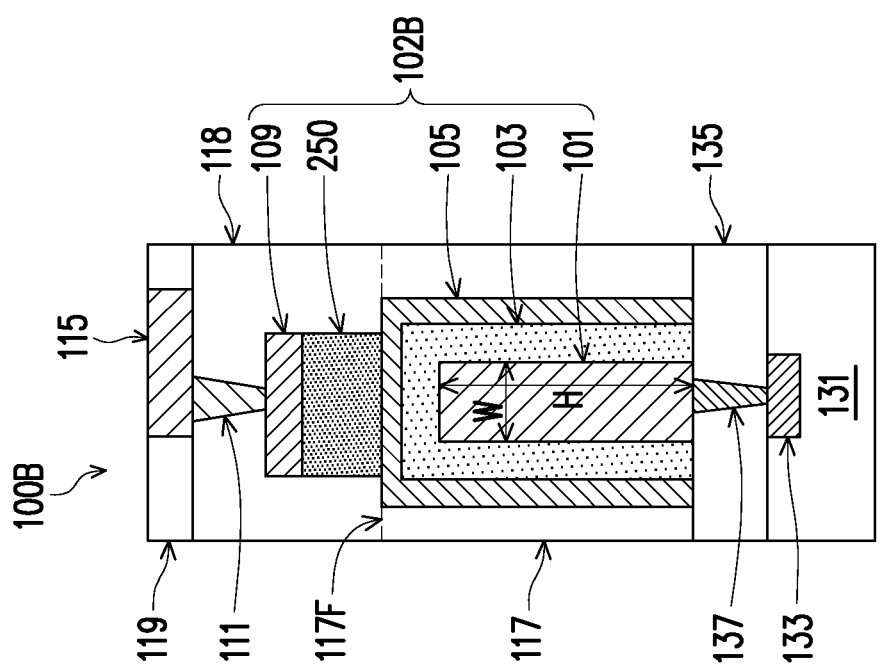
FIG. 8 illustrates a cross-sectional view of a device comprising an FTJ, in another embodiment.

FIG. 8 illustrates a cross-sectional view of a device 100B (e.g., a memory device) with an FTJ 102B, in an embodiment. The FTJ 102B is similar to the FTJ 102, but the second capacitor has a three-dimensional (3D) MIM structure. In particular, the bottom electrode 101 is formed as a metal fin protruding above the dielectric layer 135. In some embodiment, the bottom electrode 101 is formed by depositing a layer of metal or metal-containing material (e.g., Cu, W, TiN, TaN, or the like) over the dielectric layer 135, then patterning the deposited layer to form the metal fin, using, e.g., an anisotropic etching process. In the example of FIG. 8, the metal fin structure of the bottom electrode 101 has a width W between about 5 nm and about 15 nm, and a height H between about 10 nm and about 50 nm.

Once the metal fin structure is formed, the dielectric layer 103 is formed conformally over sidewalls and over an upper surface of the bottom electrode 101 (e.g., a metal fin), using a suitable deposition method such as ALD. A thickness of the dielectric layer 103 (e.g., SiO2) is less than about 2 nm, such as about 1 nm. Next, the internal metal layer 105 is formed conformally over the dielectric layer 103 and extends along sidewalls and along an upper surface of the bottom electrode 101.

Note that due to the structure of the 3D MIM structure, the area A2 of the internal metal layer 105 (or the area of the dielectric layer 103) includes areas along the sidewalls and along the upper surface of the bottom electrode 101. As a result, compared with the planar MIM structure of the second capacitor in the FTJ 102 of FIG. 6A, the FTJ 102B of FIG. 8 can achieve the same area A2 for the internal metal layer 105 with a smaller footprint over the substrate 131. This allows a higher integration density for the device 100B.

After the internal metal layer 105 is formed, the dielectric layer 117 is formed over the dielectric layer 135 and around the second capacitor (e.g., 101, 103, and 105). A planarization process, such as chemical mechanical planarization (CMP), may be performed to achieve a planar upper surface for the dielectric layer 117 and to expose the upper surface of the internal metal layer 105.

Next, the ferroelectric layer 250 and the top electrode 109 are formed successively over the internal metal layer 105, and a patterning process is performed to remove portions of the ferroelectric layer 250 and portions of the top electrode 109, similar to the processing for the device 100 of FIG. 6A. Next, a dielectric layer 118, which may be the same material as the dielectric layer 117, is formed over the dielectric layer 117. Depending on the materials of the dielectric layer 118 and/or the formation method, there may or may not be an interface 117F between the dielectric layers 118 and 117. Next, vias 111 and conductive lines 115 are formed to electrically couple to the top electrode 109 of the FTJ 102B. Note that in the example of FIG. 8, the bottom electrode 101 of the FTJ 102B is electrically coupled to, e.g., a drain of the transistor 133 by the via 137. The electrical connection between the transistor 133 and the FTJ 102B shown in FIG. 8 is merely an example, other electrical connections are also possible and are fully intended to be included within the scope of the present disclosure.

In the example of FIG. 8, the first capacitor of the FTJ 102B has a planar MFM structure, which includes the top electrode 109, the ferroelectric layer 250, and the horizontal portion of the internal metal layer 105 (e.g., the portion along the upper surface of the dielectric layer 103). The second capacitor of the FJT 102B has a three-dimensional MIM structure, which includes the internal metal layer 105, the dielectric layer 103, and the bottom electrode 101 (e.g., a metal fin). The FTJ 102B may be referred to as having a 3D MFMIM structure or as a 3D MFMIM FTJ.

Similar to the FTJ 102, the area A1 of the top electrode 109 of the FTJ 102B is smaller than the area A2 of the internal metal layer 105 of the FTJ 102B. In some embodiments, a ratio between the area A1 of the top electrode 109 and the area A2 of the internal metal layer 105 is between about 1/100 and about 1/5, such as about 1/30. Dimensions of other layers of the FTJ 102B are the same as or similar to those of the FTJ 102. For example, a thickness of the dielectric layer 103 in FIG. 8 is less than about 2 nm, such as 1 nm. A thickness of the ferroelectric layer 250 in FIG. 8 is between about 5 nm and about 20 nm.

Figure 9:
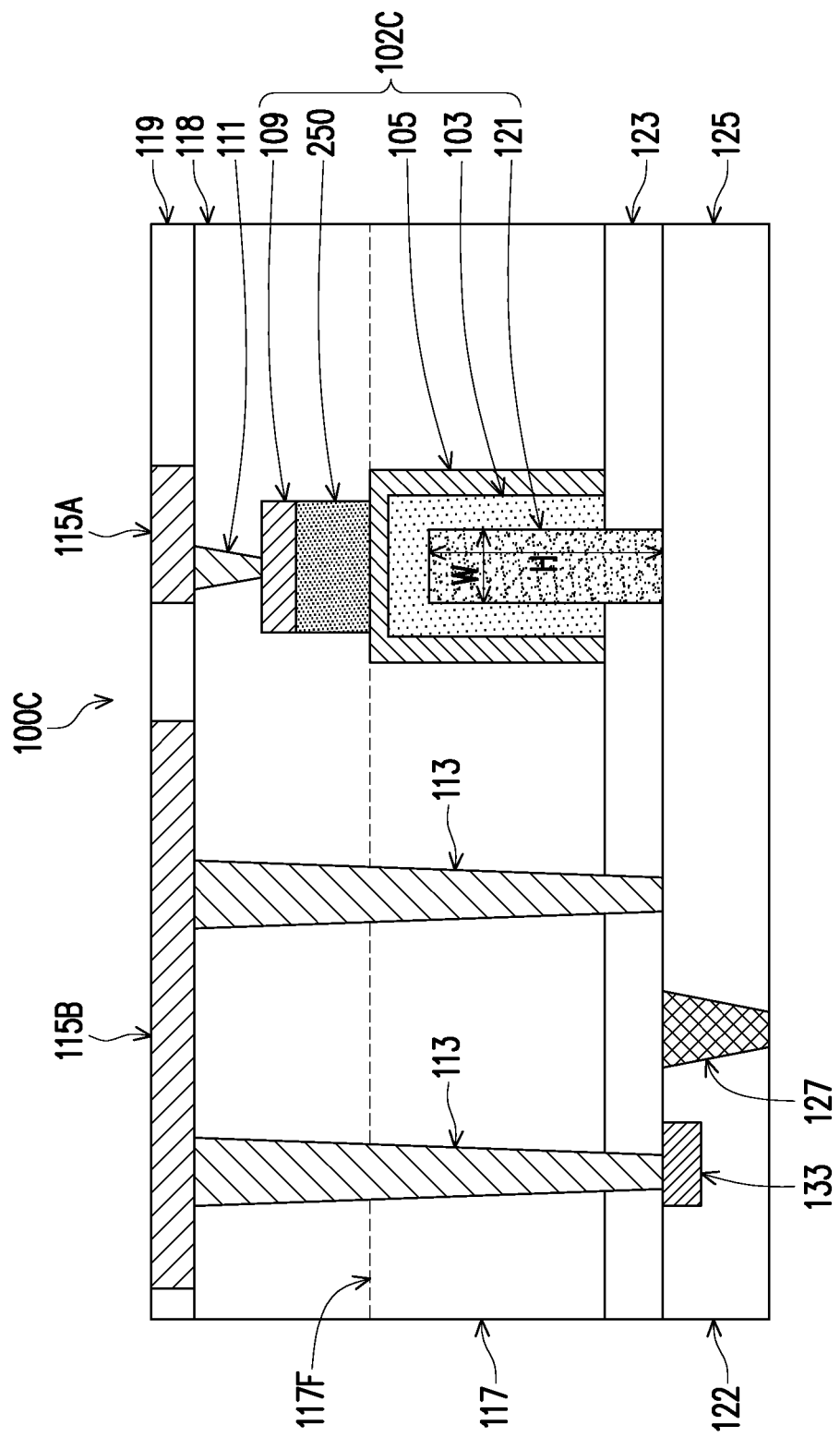
FIG. 9 illustrates a cross-sectional view of a device comprising an FTJ, in yet another embodiment.

FIG. 9 illustrates a cross-sectional view of a device 100C (e.g., a memory device) with an FTJ 102C, in an embodiment. The FTJ 102C is similar to the FTJ 102B, but the bottom electrode 121 of the FTJ 102C is a heavily doped substrate instead of a metal or a metal-containing material, which bottom electrode 121 has a fin structure protruding above a substrate 125. In the illustrated embodiment, the bottom electrode 121 is connected to the substrate 125, which is also a heavily doped substrate. In other words, the bottom electrode 121 and the substrate 125 in FIG. 9 are formed of a same heavily doped semiconductor material. In some embodiments, the fin structure of the bottom electrode 121 is formed by patterning the heavily doped semiconductor material using, e.g., an anisotropic etching process. The composition of the heavily doped semiconductor material (e.g., 121 and 125) is the same as or similar to that of the heavily doped substrate 121 of FIG. 7, thus details are not repeated here. A width W of the fin structure of the bottom electrode 121 is between about 5 nm and about 15 nm, and a height H of the fin structure of the bottom electrode 121 is between about 10 nm and about 50 nm, in some embodiments.

Referring to FIG. 9, after the bottom electrode 121 is formed, a dielectric layer 123 is formed over the substrate 125 and around the bottom electrode 121. The material and the formation method of the dielectric layer 123 may be the same as or similar to that of the dielectric layer 117, thus details are not repeated. In some embodiments, the dielectric layer 123 is omitted. Subsequent processing to form other layers of the FTJ 102C, the vias 111/113, the conductive lines 115A/115B, and the dielectric layers 117/118/119 are the same as or similar to those described above, thus details are not repeated here. The electrical connection between the transistor 133 and the FTJ 102C shown in FIG. 9 is merely an example, other electrical connections are also possible and are fully intended to be included within the scope of the present disclosure.

Note that the second capacitor of the FTJ 102C in FIG. 9, which includes the bottom electrode 121, the dielectric layer 103, and the internal metal layer 105, has a 3D MIS structure. The first capacitor of the FTJ 102C, which includes (the horizontal portion of) the internal metal layer 105, the ferroelectric layer 250, and the top electrode 109, has a planar MFM structure. The FTJ 102C may be referred to as having a 3D MFMIS structure or as a 3D MFMIS FTJ. Similar to the discussion above for the FTJ 102B, the 3D MIS structure of the second capacitor of the FTJ 102C allows for a large area A2 (e.g., areas along sidewalls and a top surface of the bottom electrode 121) for the internal metal layer 105 with a small footprint over the substrate 125, which allows for higher integration density for the memory array 400.

Similar to the FTJ 102B, the area A1 of the top electrode 109 of the FTJ 102C is smaller than the area A2 of the internal metal layer 105 of the FTJ 102C. In some embodiments, a ratio between the area A1 of the top electrode 109 and the area A2 of the internal metal layer 105 is between about 1/100 and about 1/5, such as about 1/30. Dimensions of other layers of the FTJ 102C are the same as or similar to those of the FTJ 102. For example, a thickness of the dielectric layer 103 in FIG. 9 is less than about 2 nm, such as 1 nm. A thickness of the ferroelectric layer 250 in FIG. 9 is between about 5 nm and about 20 nm.

Figure 10:
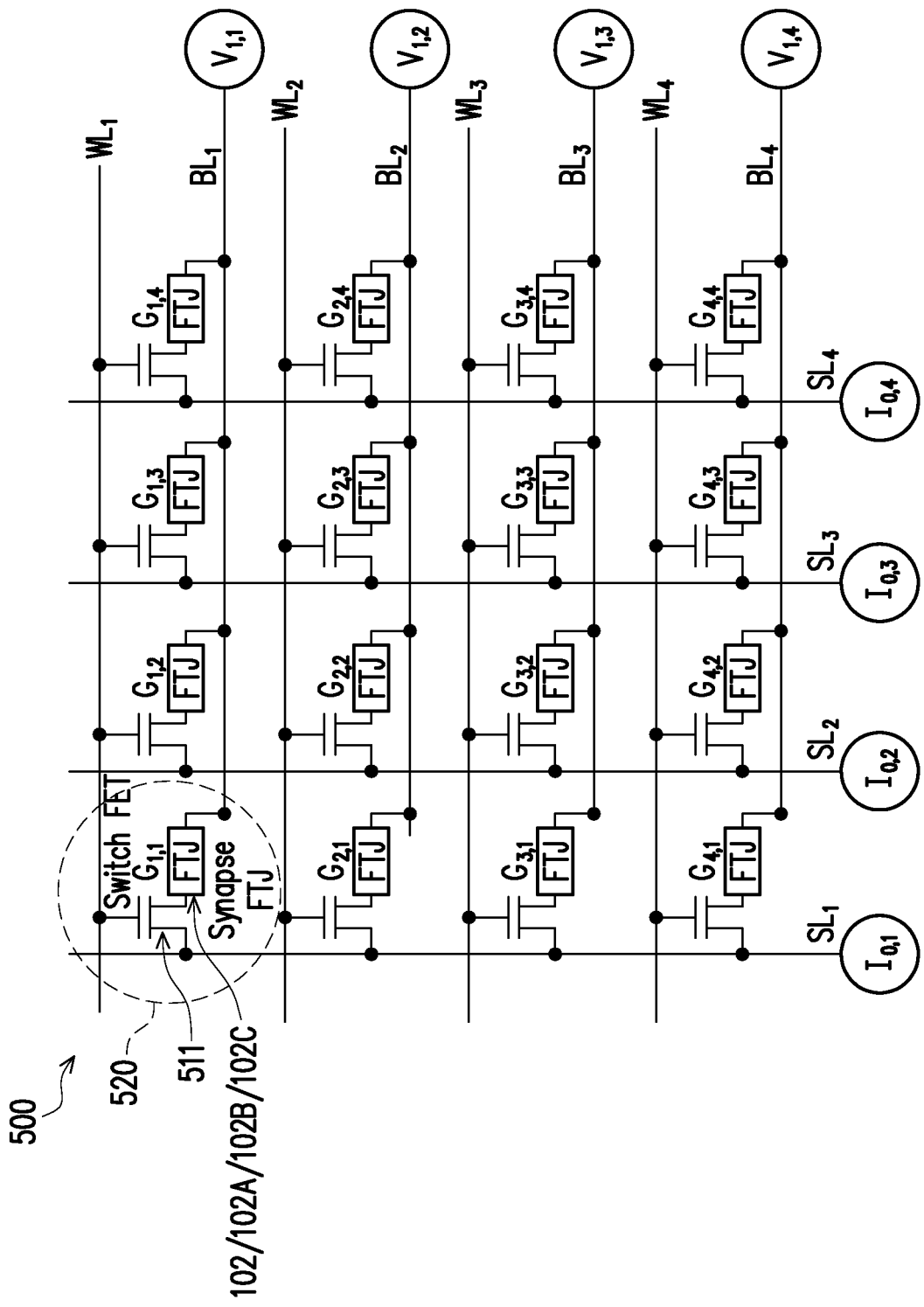
FIG. 10 illustrates a schematic view of a memory array formed using FTJs, in an embodiment.

FIG. 10 illustrates a schematic view of a memory array 500 formed using the FTJs, in an embodiment. The memory array 500 of FIG. 10 is a 4×4 array formed with sixteen 1T1FTJ analog non-volatile memory cells, where T stands for transistor, and FTJ stands for ferroelectric tunnel junction. The size (e.g., 4×4) of the memory array 500 shown in FIG. 10 is a non-limiting example. One skilled in the art will readily appreciate that the memory array may have any other dimensions.

In FIG. 10, each memory cell 520 includes a transistor 511 (also referred to as a switching transistor, or a switching FET) connected to a respective FTJ. The FTJ can be any suitable FTJ formed using the ferroelectric film 250, such that the TER of the FTJ has a plurality (e.g., more than 2) of different values that are programmable by a programming voltage. For example, the FTJ 102, 102A, 102B, or 102C may be used to form the memory cell 520. For ease of discussion, the FTJ in the memory array 500 will be referred to FTJ 102, with the understanding that any suitable FTJ may be used.

For each memory cell 520, a drain of the switching transistor 511 is connected to a first terminal of the FTJ 102. FIG. 10 further illustrates bit lines BL1, BL2, BL3, and BL4, and word lines WL1, WL2, WL3, and WL4. The second terminal of each FTJ 102 is connected to a bit line, and the second terminals of FTJs 102 disposed along a same row in FIG. 10 are connected to a same bit line. Each of the word lines is connected to the gates of respective switching transistors 511 disposed along a same row. For example, the word line WL1 is connected to the gates of four switching transistors 511 disposed in the top row of the memory array in FIG. 10. In addition, FIG. 10 illustrates output lines SL1, SL2, SL3, and SL4, and each of the output lines is connected to the sources of respective switching transistors 511 disposed along a same column. For example, the output line SL1 is connected to the sources of the four switching transistors 511 disposed in the leftmost column of the memory array of FIG. 10.

As discussed above, the conductance (e.g., inverse of the TER) of the FTJ 102 in each memory cell can be programmed to different values through the programming voltage. The conductance of the FTJ 102 in each memory cell of FIG. 10 may serve as an element (e.g., a coefficient) in a 4×4 matrix that is used to implement the Multiply-Accumulate (MAC) operations in analog computing. An example is discussed below to demonstrate how the FTJ 102 is used as analog NMV synapse in analog computing.

Consider an example where the conductance of each FTJ 102 is programmed to a different value $G_{i,j}$, wherein i and j denotes the row number and the column number in the memory array at which the FTJ 102 is located. For example, the FTJs 102 at the first row of the memory array 500 have conductances $G_{1,1}$, $G_{1,2}$, $G_{1,3}$, and $G_{1,4}$. A weight update operation may be performed to program the conductances of the FTJs 102. In the weight update operation, to program the conductance $G_{i,j}$ of the FTJ 102 located on the i-th row and j-th column, a high voltage is applied at the word lines WLi to turn on the switching transistors 511 in the i-th row, and a programming voltage (e.g., a sequence of gradually increasing or gradually decreasing voltage pulses) is applied at the output line SLj to set (e.g., program) the conductance $G_{i,j}$ of the FTJ 102 on the i-th row and j-th column. Note that the example here assumes that the switching transistor 511 is an N-type device, thus a high voltage (e.g., +3V, +5V) is used to turn on the switching transistor 511.

After the conductances of all the FTJ 102 in the memory array 500 are programmed, the analog computing is performed by an inference operation. In the inference operation, a high voltage is applied to all of the word lines WL1, WL2, WL3, and WL4 to turn on all of the switching transistors 511. Input voltages $V_{I,1}$, $V_{I,2}$, $V_{I,3}$, and $V_{I,4}$ are applied to the bit lines BL1, BL2, BL3, and BL4, respectively. The current measured at the lower ends (see the ends with labels $I_{o,1}$, $I_{o,2}$, $I_{o,3}$, and $I_{o,4}$) of the output lines SL1, SL2, SL3, and SL4 is given by $$I_{o,j} = \sum_{k=1}^{4} G_{j,k} V_{I,k} \qquad (2)$$

where j=1, 2, 3, or 4. Note that the output currents measured at the lower ends of each output line (e.g., SL1, SL2, SL3, or SL4) automatically achieves the MAC operations in Equation (2). In particular, by functioning as a programmable resistor, each FTJ 102 converts a respective input voltage (e.g., $V_{I,1}$, $V_{I,2}$, $V_{I,3}$, or $V_{I,4}$) into a respective output current, thereby achieving the multiply operations in Equation (2) without using digital multipliers. In addition, the output currents of all the FTJs 102 disposed on a same column of the memory array are naturally added together, as dictated by the Kirchhoff's Current Law, thereby achieving the accumulate operations without using digital adders.

Variations to the disclosed embodiments are possible and are fully intended to be included within the scope of the present disclosure. For example, the internal metal layer 213 of the FeFET 200 (see FIG. 3) may be omitted to form an FeFET with a MFIS structure, and the MFIS FeFET may replace the FeFET 200, e.g., in FIG. 5 to form the memory device. As another example, the ferroelectric film 250 may be formed between, and in physical contact with, a bottom electrode (e.g., a metal or a metal-containing layer) and a top electrode (e.g., a metal or a metal-containing layer) to form an FTJ with an MFM structure. As yet another example, the ferroelectric film 250 may be formed between, and in physical contact with, a bottom electrode (e.g., a heavily doped substrate) and a top electrode (e.g., a metal or a metal-containing layer) to form an FTJ with an MFS structure. The MFM FTJ or the MFS FTJ may replace the FTJs used in FIG. 10 to form the memory device. While the disclosed ferroelectric film 250 achieves multiple polarization switching point (see, e.g., FIG. 2C) by forming grains with random polarizations, the current disclosure also contemplates varying the sizes of the grains of the ferroelectric film 250 (e.g., grains with random sizes) as an additional tuning nob to achieve the target characteristics for the ferroelectric film 250.

Disclosed embodiments achieve advantages. For example, by forming the ferroelectric film 250 with random polarization directions, the FeFET formed using the ferroelectric film 250 has a plurality (e.g., three or more) of programmable threshold voltages and may function as a programmable resistor. Similarly, FTJ formed using the ferroelectric film 250 has a plurality (e.g., three or more) of programmable resistance values (or conductance values). The disclosed FeFET and FTJ may be used to form analog NVM synapse used in analog computing, thereby avoiding the complex and computational intensive operations involved with matrix multiplication. In addition, by having the internal metal layer 105 in the FTJ, and by designing the area A1 of the top electrode 109 to be smaller than the area A2 of the internal metal layer 105, only a small percentage of the voltage V applied at the two terminals of the FTJ is applied across the dielectric layer 103, which reduces the E-field in the dielectric layer 103 and reduces or avoids breakdown of the dielectric layer 103, thus improving the endurance of the FTJ. In addition, using high-K dielectric material for the dielectric layer 103 further reduces the E-field of the dielectric layer 103, and may further improve the endurance of the device formed. The disclosed 3D MFMIM FTJ or 3D MFMIS FTJ allows for higher integration density than the planar FTJs.

Figure 11:
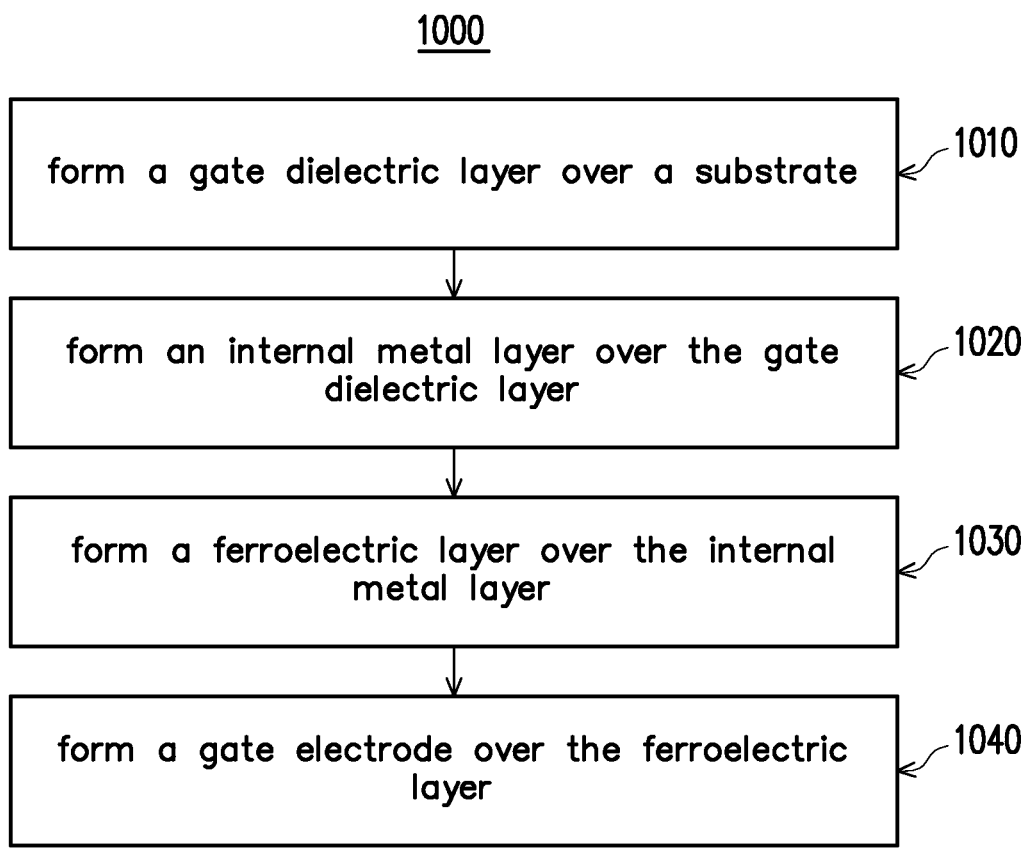
FIG. 11 illustrates a flow chart of a method of forming a device that comprises an FeFET, in some embodiments.

FIG. 11 illustrates a flow chart of a method of fabricating a device, in accordance with some embodiments. It should be understood that the embodiment method shown in FIG. 11 is merely an example of many possible embodiment methods. One of ordinary skill in the art would recognize many variations, alternatives, and modifications. For example, various steps as illustrated in FIG. 11 may be added, removed, replaced, rearranged or repeated.

Referring to FIG. 11, at step 1010, a gate dielectric layer is formed over a substrate. At step 1020, an internal metal layer is formed over the gate dielectric layer. At step 1030, a ferroelectric layer is formed over the internal metal layer. At step 1040, a gate electrode is formed over the ferroelectric layer.

In accordance with an embodiment, a semiconductor device includes: a ferroelectric field-effect transistor (FeFET) including: a substrate; a source region in the substrate; a drain region in the substrate; and a gate structure over the substrate and between the source region and the drain region, wherein the gate structure includes: a gate dielectric layer over the substrate; a ferroelectric film over the gate dielectric layer; and a gate electrode over the ferroelectric film. In an embodiment, the gate structure further includes an internal metal layer between the gate dielectric layer and the ferroelectric film. In an embodiment, the ferroelectric film comprises a plurality of grains that have random polarization directions. In an embodiment, a threshold voltage of the FeFET is adjustable and has more than two different threshold voltage values. In an embodiment, the threshold voltage of the FeFET is configured to be adjusted by applying a sequence of voltage pulses with gradually increasing or gradually decreasing voltages to the gate electrode of the FeFET. In an embodiment, the ferroelectric film comprises doped hafnium oxide. In an embodiment, the doped hafnium oxide is a hafnium oxide doped by silicon, aluminum, zirconium, gadolinium, or yttrium. In an embodiment, a thickness of the ferroelectric film is between about 5 nm and about 20 nm. In an embodiment, a conductance of the FeFET measured between the source region and the drain region of the FeFET is adjustable and has more than two different conductance values, wherein the conductance of the FeFET is configured to be adjusted by applying a sequence of programming voltages with gradually increasing or gradually decreasing voltage values to the gate electrode of the FeFET. In an embodiment, the semiconductor device further includes: a switching transistor, wherein a source region of the switching transistor is coupled to the gate electrode of the FeFET; a word line coupled to a gate of the switching transistor; a programming line coupled to a drain region of the switching transistor; a bit line connected to the drain region of the FeFET; and an output line connected to the source region of the FeFET.

In accordance with an embodiment, a semiconductor device includes a substrate; and a ferroelectric tunnel junction (FTJ) over the substrate, the FTJ comprising: a bottom electrode over the substrate; a dielectric layer over the bottom electrode; an internal metal layer over the dielectric layer; a ferroelectric layer over the internal metal layer; and a top electrode over the ferroelectric layer, wherein a tunneling electroresistance (TER) of the FTJ is adjustable and have more than two different values. In an embodiment, the TER of the FTJ is configured to be adjusted by applying a sequence of voltage pulses with increasing or decreasing voltages between the top electrode and the bottom electrode. In an embodiment, the top electrode and the ferroelectric layer have a same first surface area, wherein the internal metal layer and the dielectric layer have a same second surface area, the second surface area being larger than the first surface area. In an embodiment, the ferroelectric layer is a doped hafnium oxide, and wherein a thickness of the ferroelectric layer is between about 5 nm and about 20 nm. In an embodiment, the ferroelectric layer comprises a plurality of grains that have random polarization directions. In an embodiment, the bottom electrode is a fin protruding above the substrate, wherein the dielectric layer and the internal metal layer extend conformally along sidewalls and a top surface of the fin.

In accordance with an embodiment, a method of forming a device that comprises a ferroelectric field-effect transistor (FeFET) includes: forming a gate dielectric layer over a substrate; forming an internal metal layer over the gate dielectric layer; forming a ferroelectric layer over the internal metal layer; and forming a gate electrode over the ferroelectric layer. In an embodiment, the ferroelectric layer is formed of a doped hafnium oxide with a thickness between about 5 nm and about 20 nm. In an embodiment, the doped hafnium oxide is a hafnium oxide doped by silicon, aluminum, zirconium, gadolinium, or yttrium. In an embodiment, the method further includes, after forming the gate electrode, performing an anneal process at a temperature between about 500° C. and about 600° C.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
a substrate; and
a ferroelectric tunnel junction (FTJ) over the substrate, the FTJ comprising:
a first capacitor comprising:
a bottom electrode over the substrate;
a dielectric layer over the bottom electrode; and
an internal metal layer over the dielectric layer; and
a second capacitor coupled in series with the first capacitor, comprising:
the internal metal layer;
a ferroelectric layer over the internal metal layer; and
a top electrode over the ferroelectric layer, wherein a first capacitance of the first capacitor is larger than the second capacitance of the second capacitor.

2. The semiconductor device of claim 1, wherein in a top view, the internal metal layer has a same first surface area as the dielectric layer, and the top electrode has a same second surface area as the ferroelectric layer, wherein the second surface area is smaller than the first surface area.

3. The semiconductor device of claim 2, wherein in the top view, the internal metal layer and the dielectric layer have a same first boundary, and the top electrode and the ferroelectric layer have a same second boundary.

4. The semiconductor device of claim 1, wherein a tunneling electroresistance (TER) of the FTJ is adjustable and has more than two different values.

5. The semiconductor device of claim 1, wherein a tunneling electroresistance (TER) of the FTJ is adjustable by applying, between the top electrode and the bottom electrode, a sequence of voltage pulses with increasing or decreasing voltages.

6. The semiconductor device of claim 5, wherein the TER has more than two different values.

7. The semiconductor device of claim 1, wherein the bottom electrode is a doped region of the substrate.

8. The semiconductor device of claim 1, wherein the bottom electrode is a metal-containing material disposed on an upper surface of the substrate.

9. The semiconductor device of claim 1, wherein the ferroelectric layer is a hafnium oxide doped by a dopant.

10. The semiconductor device of claim 1, wherein the ferroelectric layer comprises a plurality of grains with random polarization directions.

11. A semiconductor device comprising:
a substrate; and
a ferroelectric tunnel junction (FTJ) over the substrate, the FTJ comprising:
a fin structure protruding above the substrate;
a dielectric layer extending along sidewalls of the fin structure and along an upper surface of the fin structure;
an internal metal layer over the dielectric layer;
a ferroelectric layer over an upper surface of the internal metal layer distal from the substrate, wherein sidewalls of the internal metal layer along the sidewalls of the fin structure are free of the ferroelectric layer; and
a top electrode over the ferroelectric layer.

12. The semiconductor device of claim 11, wherein the fin structure is a metal fin protruding above the substrate.

13. The semiconductor device of claim 11, wherein the fin structure and the substrate comprise a same semiconductor material doped by a dopant.

14. The semiconductor device of claim 13, further comprising another dielectric layer on an upper surface of the substrate facing the fin structure, wherein a lower portion of the fin structure is embedded in the another dielectric layer, and an upper portion of the fin structure protrudes above the another dielectric layer.

15. The semiconductor device of claim 14, wherein the dielectric layer extends along the upper portion of the fin structure but not along the lower portion of the fin structure.

16. The semiconductor device of claim 11, wherein a tunneling electroresistance (TER) of the FTJ is adjustable and is configured to be adjusted by applying, between the top electrode and the fin structure, a sequence of voltage pulses with increasing or decreasing voltages.

17. A memory device comprising:
a switching transistor, wherein a gate terminal of the switching transistor is coupled to a word line (WL) of the memory device, and a drain terminal of the switching transistor is coupled to a programming line (PRL) of the memory device; and
a ferroelectric field-effect transistor (FeFET) coupled to the switching transistor, the FeFET comprising:
a source region;
a drain region; and
a gate structure between the source region and the drain region, wherein the gate structure comprises:
a gate dielectric layer;
a ferroelectric film over the gate dielectric layer; and
a gate electrode over the ferroelectric film, wherein a threshold voltage of the FeFET is programmable and has more than two values that change continuously within a pre-determined range, wherein the gate electrode of the FeFET is coupled to a source terminal of the switching transistor, the drain region of the FeFET is coupled to a bit line (BL) of the memory device, and the source region of the FeFET is coupled to an output line (SL) of the memory device.

18. The memory device of claim 17, wherein the gate structure of the FeFET further comprises an internal metal layer between the gate dielectric layer and the ferroelectric film.

19. The memory device of claim 17, wherein the threshold voltage of the FeFET is configured to be programmed by a sequence of voltage pulses having continuously increasing or continuously decreasing amplitudes.

20. The memory device of claim 17, wherein the ferroelectric film comprises hafnium oxide doped by a dopant, wherein the dopant is silicon, aluminum, zirconium, gadolinium, or yttrium.

* * * * *